US012719409B2

(12) United States Patent
Lin

(10) Patent No.: US 12,719,409 B2
(45) Date of Patent: Aug. 25, 2026

(54) DATA RECEIVING CIRCUIT, DATA RECEIVING SYSTEM AND STORAGE APPARATUS

(71) Applicant: CHANGXIN MEMORY TECHNOLOGIES, INC., Hefei City (CN)

(72) Inventor: Feng Lin, Hefei (CN)

(73) Assignee: CHANGXIN MEMORY TECHNOLOGIES, INC., Hefei City (CN)

( * ) Notice: Subject to any disclaimer, the term of this patent is extended or adjusted under 35 U.S.C. 154(b) by 1028 days.

(21) Appl. No.: 17/901,912

(22) Filed: Sep. 2, 2022

(65) Prior Publication Data

US 2023/0421103 A1 Dec. 28, 2023

Related U.S. Application Data

(63) Continuation of application No. PCT/CN2022/104758, filed on Jul. 8, 2022.

(30) Foreign Application Priority Data

Jun. 23, 2022 (CN) ......................... 202210726636.9

(51) Int. Cl.
*H03F 1/02* (2006.01)
*H03F 3/16* (2006.01)

(52) U.S. Cl.
CPC ............. *H03F 1/0205* (2013.01); *H03F 3/16* (2013.01)

(58) Field of Classification Search
CPC ....... H03F 1/0205; H03F 3/16; G11C 7/1057; G11C 7/106; G11C 7/1084;
(Continued)

(56) References Cited

U.S. PATENT DOCUMENTS 6,151,648 A 11/2000 Haq
6,160,423 A 12/2000 Haq
(Continued)

FOREIGN PATENT DOCUMENTS

CN 104183258 A 12/2014
CN 108694962 A 10/2018
(Continued)

OTHER PUBLICATIONS

US patent office action in U.S. Appl. No. 17/952,394, mailed on Aug. 13, 2024.

(Continued)

*Primary Examiner* — Andrea Lindgren Baltzell
*Assistant Examiner* — Jose E Pinero
(74) *Attorney, Agent, or Firm* — Syncoda LLC; Feng Ma

(57) ABSTRACT

A data receiving circuit, data receiving system and storage apparatus are provided. The data receiving circuit includes: a first amplification circuit configured to receive a data signal, first and second reference signals, perform first comparison on the data signal and first reference signal to output a first signal pair and perform second comparison on the data signal and second reference signal to output a second signal pair; a decision equalization enable circuit configured to receive an enable signal and feedback signal and output a control signal where the enable signal has a first level value period, a level value of the control signal varies with that of the feedback signal; and a second amplification circuit configured to receive the first or second signal pair based on the control signal and output first and second output signals.

18 Claims, 7 Drawing Sheets

(58) Field of Classification Search

CPC . G11C 11/4093; G11C 7/1093; G11C 7/1087; G11C 7/1078; G11C 7/1048; H04L 25/03006

USPC .......................................................... 330/277

See application file for complete search history.

(56) References Cited

U.S. PATENT DOCUMENTS

| | | | | |
|---|---|---|---|---|
| 6,504,778 | B1 | 1/2003 | Ekubo | |
| 6,965,262 | B2 * | 11/2005 | Zerbe | H03K 17/162 327/51 |
| 7,477,704 | B1 | 1/2009 | Cornelius | |
| 9,542,991 | B1 | 1/2017 | Xie | |
| 9,806,918 | B1 | 10/2017 | Su | |
| 10,091,031 | B1 | 10/2018 | Dimitriu | |
| 2001/0020853 | A1 | 9/2001 | Haq | |
| 2005/0040867 | A1 | 2/2005 | Haq | |
| 2005/0242847 | A1 | 11/2005 | Haq | |
| 2006/0012402 | A1 | 1/2006 | Haq | |
| 2007/0201291 | A1 | 8/2007 | Cho | |
| 2008/0088365 | A1 | 4/2008 | Jang | |
| 2008/0089155 | A1 * | 4/2008 | Bae | G11C 7/1078 365/205 |
| 2009/0296508 | A1 | 12/2009 | Cho | |
| 2010/0246693 | A1 | 9/2010 | Ushio et al. | |
| 2012/0063242 | A1 | 3/2012 | Kim | |
| 2014/0347098 | A1 | 11/2014 | Ecker et al. | |
| 2018/0294784 | A1 | 10/2018 | Kim et al. | |
| 2019/0222444 | A1 | 7/2019 | Sreeramaneni et al. | |
| 2020/0119955 | A1 * | 4/2020 | Ahn | H04B 3/32 |
| 2020/0194043 | A1 | 6/2020 | Karim | |
| 2021/0174844 | A1 | 6/2021 | Choi | |
| 2021/0408970 | A1 * | 12/2021 | Hong | H03F 1/26 |
| 2022/0173744 | A1 * | 6/2022 | Lee | H03K 5/2481 |
| 2023/0012066 | A1 * | 1/2023 | Gu | H04L 25/03146 |
| 2023/0016678 | A1 | 1/2023 | Lin | |
| 2023/0421103 | A1 | 12/2023 | Lin | |
| 2024/0005966 | A1 | 1/2024 | Lin | |

FOREIGN PATENT DOCUMENTS

| | | | |
|---|---|---|---|
| CN | 109328434 | A | 2/2019 |
| CN | 111049540 | A | 4/2020 |
| CN | 111052240 | A | 4/2020 |
| CN | 111614332 | A | 9/2020 |
| CN | 112204662 | A | 1/2021 |
| CN | 113556104 | A | 10/2021 |
| CN | 113852367 | A | 12/2021 |
| KR | 20120027586 | A | 3/2012 |
| KR | 20210073217 | A | 6/2021 |

OTHER PUBLICATIONS

Supplementary European Search Report in the European application No. 22854456.5, mailed on Feb. 7, 2024, 10 pages.

US office action in U.S. Appl. No. 18/154,794, mailed on Sep. 28, 2024.

KR first office action in application No. 10-2023-7003894 mailed on Sep. 27, 2024.

* cited by examiner

DATA RECEIVING CIRCUIT, DATA RECEIVING SYSTEM AND STORAGE APPARATUS

CROSS-REFERENCE TO RELATED APPLICATIONS

This application is a continuation application of International Patent Application No. PCT/CN2022/104758, filed on Jul. 8, 2022, which claims priority to Chinese Patent Application No. 202210726636.9, filed on Jun. 23, 2022 and entitled "DATA RECEIVING CIRCUIT, DATA RECEIVING SYSTEM AND STORAGE APPARATUS". The disclosures of the above-referenced applications are hereby incorporated by reference in their entirety.

BACKGROUND

In the application of a memory, as a signal transmission rate becomes faster and faster, channel loss has a greater and greater impact on the signal quality, which may easily lead to intersymbol interference. In addition, a difference in level value between a data signal received by a data receiving circuit in the memory and a reference signal may affect the determination of the data receiving circuit on the data signal, resulting in impact on the accuracy of a signal outputted by the data receiving circuit.

Currently, a channel is usually compensated by an equalization circuit. A Continuous Time Linear Equalizer (CTLE) or a Decision Feedback Equalizer (DFE) may be selected as an equalization circuit. However, the accuracy of the signal output by the equalization circuit currently used needs to be improved, the receiving performance of the equalization circuit needs to be improved, and the power consumption of the equalization circuit needs to be reduced.

SUMMARY

Embodiments of the disclosure provide a data receiving circuit, a data receiving system and a storage apparatus, which at least reduces the power consumption of the data receiving circuit while the receiving performance of the data receiving circuit is improved.

According to some embodiments of the disclosure, an aspect of an embodiment of the disclosure provides a data receiving circuit, including: a first amplification circuit, configured to receive a data signal, a first reference signal and a second reference signal, perform first comparison on the data signal and the first reference signal to output a first signal pair as a result of the first comparison, perform second comparison on the data signal and the second reference signal to output a second signal pair as a result of the second comparison, where a level value of the first reference signal is different from a level value of the second reference signal, the first signal pair includes a first signal and a second signal, and the second signal pair includes a third signal and a fourth signal; a decision equalization enable circuit, configured to receive an enable signal and a feedback signal, and output a control signal, where the feedback signal is obtained based on previously received data, the enable signal has a first level value period, a level value of the control signal varies with a level value of the feedback signal, the enable signal has a second level value period, the level value of the control signal is a fixed value, and a first level value is different from a second level value; and a second amplification circuit, configured to selectively receive the first signal pair or the second signal pair as an input signal pair based on the control signal, amplify a voltage difference of the input signal pair, and output a first output signal and a second output signal as an amplification result.

In some embodiments, the first amplification circuit includes: a first comparison circuit, having a first node and a second node and configured to receive the data signal and the first reference signal and perform the first comparison on the data signal and the first reference signal, and output the first signal and the second signal via the first node and the second node respectively; and a second comparison circuit, having a third node and a fourth node and configured to receive the data signal and the second reference signal and perform the second comparison on the data signal and the second reference signal, and output the third signal and the fourth signal via the third node and the fourth node respectively.

In some embodiments, the first comparison circuit includes: a first current source connected between a power node and a fifth node for supplying a current to the fifth node in response to a first sampling clock signal; and a first comparison unit, connected to the first node, the second node and the fifth node, and configured to receive the data signal and the first reference signal, perform the first comparison when the first current source supplies the current to the fifth node, and output the first signal and the second signal. The second comparison circuit includes: a second current source connected between the power node and a sixth node for supplying a current to the sixth node in response to a second sampling clock signal; and a second comparison unit, connected to the third node, the fourth node and the sixth node, and configured to receive the data signal and the second reference signal, perform the second comparison when the second current source supplies the current to the sixth node, and output the third signal and the fourth signal.

In some embodiments, the first current source includes: a first PMOS transistor, connected between the power node and the fifth node. A gate of the first PMOS transistor receives the first sampling clock signal. The second current source includes: a second PMOS transistor, connected between the power node and the sixth node. A gate of the second PMOS transistor receives the second sampling clock signal.

In some embodiments, the first comparison unit includes: a third PMOS transistor, connected between the first node and the fifth node, where a gate of the third PMOS transistor receives the data signal; and a fourth PMOS transistor, connected between the second node and the fifth node, where a gate of the fourth PMOS transistor receives the first reference signal. The second comparison unit includes: a fifth PMOS transistor, connected between the third node and the sixth node, where a gate of the fifth PMOS transistor receives the data signal; and a sixth PMOS transistor, connected between the fourth node and the sixth node. A gate of the sixth PMOS transistor receives the second reference signal.

In some embodiments, the first amplification circuit further includes: a first reset circuit, connected to the first node and the second node and configured to reset the first node and the second node; and a second reset circuit, connected to the third node and the fourth node and configured to reset the third node and the fourth node.

In some embodiments, the first reset circuit includes: a first NMOS transistor, connected between the first node and ground, where a gate of the first NMOS transistor receives the first sampling clock signal; and a second NMOS transistor, connected between the second node and the ground, where a gate of the second NMOS transistor receives the first sampling clock signal. The second reset circuit includes: a third NMOS transistor, connected between the third node and the ground, where a gate of the third NMOS transistor receives the second sampling clock signal; and a fourth NMOS transistor, connected between the fourth node and the ground. A gate of the fourth NMOS transistor receives the second sampling clock signal.

In some embodiments, the second amplification circuit includes: a first input circuit, connected to a seventh node and an eighth node, and configured to be turned on in response to the control signal to receive the first signal pair and perform a third comparison, and provide a signal to the seventh node and the eighth node respectively as a result of the third comparison; a second input circuit, connected to the seventh node and the eighth node, and configured to be turned on in response to the control signal to receive the second signal pair and perform a fourth comparison, and provide a signal to the seventh node and the eighth node respectively as a result of the fourth comparison, where the first input circuit and the second input circuit are alternatively turned on based on the control signal; and a latch circuit, connected to the seventh node and the eighth node, and configured to amplify and latch the signal of the seventh node and the signal of the eighth node, and output the first output signal and the second output signal via a first output node and a second output node.

In some embodiments, the feedback signal includes a differential first feedback signal and second feedback signal. The control signal includes a differential first control signal and second control signal. The first input circuit is turned on in response to the first control signal, and the second input circuit is turned on in response to the second control signal. The decision equalization enable circuit includes: a first enable circuit, configured to receive the enable signal and the feedback signal, and output the first control signal, where the enable signal has the first level value period, a level value of the first control signal varies with a level value of the first feedback signal, the enable signal has the second level value period, and the level value of the first control signal is a fixed value; and a second enable circuit, configured to receive a complementary enable signal and the second feedback signal, and output the second control signal. The complementary enable signal and the enable signal are differential signals for each other. The complementary enable signal has the second level value period. A level value of the second control signal varies with a level value of the second feedback signal. The complementary enable signal has the first level value period, and the level value of the second control signal is a fixed value.

In some embodiments, the decision equalization enable circuit further includes: a first NAND gate circuit, configured to receive the enable signal and a third sampling clock signal, and output a second sampling clock signal. A phase of the third sampling clock signal is opposite to that of a first sampling clock signal.

In some embodiments, the first enable circuit is a second NAND gate unit. The second enable circuit is a NOR gate unit. The first level value is a high level, and the second level value is a low level. The second NAND gate circuit receives the first feedback signal and the enable signal. The NOR gate circuit receives the second feedback signal and the complementary enable signal.

In some embodiments, the first input circuit includes: a fifth NMOS transistor and a sixth NMOS transistor, where a drain of the fifth NMOS transistor is connected to the seventh node, a source of the fifth NMOS transistor is connected to a drain of the sixth NMOS transistor, a source of the sixth NMOS transistor is connected to ground, a gate of the fifth NMOS transistor receives one of the first signal or the first control signal, and a gate of the sixth NMOS transistor receives the other of the first signal or the first control signal; and a seventh NMOS transistor and an eighth NMOS transistor. A drain of the seventh NMOS transistor is connected to the eighth node. A source of the seventh NMOS transistor is connected to a drain of the eighth NMOS transistor. A source of the eighth NMOS transistor is connected to the ground. A gate of the seventh NMOS transistor receives one of the second signal or the first control signal, and a gate of the eighth NMOS transistor receives the other of the second signal or the first control signal. The second input circuit includes: a ninth NMOS transistor and a tenth NMOS transistor, where a drain of the ninth NMOS transistor is connected to the seventh node, a source of the ninth NMOS transistor is connected to a drain of the tenth NMOS transistor, a source of the tenth NMOS transistor is connected to the ground, a gate of the ninth NMOS transistor receives one of the third signal or the second control signal, and a gate of the tenth NMOS transistor receives the other of the third signal or the second control signal; and an eleventh NMOS transistor and a twelfth NMOS transistor. A drain of the eleventh NMOS transistor is connected to the eighth node. A source of the eleventh NMOS transistor is connected to a drain of the twelfth NMOS transistor. A source of the twelfth NMOS transistor is connected to the ground. A gate of the eleventh NMOS transistor receives one of the fourth signal or the second control signal, and a gate of the twelfth NMOS transistor receives the other of the fourth signal or the second control signal.

In some embodiments, the latch circuit includes: a thirteenth NMOS transistor and a seventh PMOS transistor, where a gate of the thirteenth NMOS transistor and a gate of the seventh PMOS transistor are connected to the second output node, a source of the thirteenth NMOS transistor is connected to the seventh node, a drain of the thirteenth NMOS transistor and a drain of the seventh PMOS transistor are connected to the first output node, and a source of the seventh PMOS transistor is connected to a power node; and a fourteenth NMOS transistor and an eighth PMOS transistor. A gate of the fourteenth NMOS transistor and a gate of the eighth PMOS transistor are connected to the first output node. A source of the fourteenth NMOS transistor is connected to the eighth node. A drain of the fourteenth NMOS transistor and a drain of the eighth PMOS transistor are connected to the second output node. A source of the eighth PMOS transistor is connected to the power node.

In some embodiments, the second amplification circuit further includes: a third reset circuit, connected between a power node and an output end of the latch circuit, and configured to reset the output end of the latch unit.

In some embodiments, the third reset circuit includes: a ninth PMOS transistor, connected between the first output node and a power node, where a gate of the ninth PMOS transistor receives a fourth sampling clock signal; and a tenth PMOS transistor, connected between the second output node and the power node. A gate of the tenth PMOS transistor receives the fourth sampling clock signal.

According to some embodiments of the disclosure, another aspect of an embodiment of the disclosure further provides a data receiving system, including: a plurality of cascaded data transmission circuits, each of which includes any of the data receiving circuits described above and a latch circuit connected to the data receiving circuit. An output signal of the data transmission circuit in a previous stage is used as a feedback signal of the data transmission circuit in a next stage. An output signal of the data transmission circuit in a last stage is used as a feedback signal of the data transmission circuit in a first stage.

In some embodiments, the data receiving circuit receives data in response to a sampling clock signal. The data receiving system includes 4 cascaded data transmission circuits, and a phase difference between the sampling clock signals of the adjacent stage data receiving circuits is 90°.

In some embodiments, a decision equalization enable circuit of the data receiving circuit in a current stage is connected to an output end of a second amplification circuit of the data receiving circuit in a previous stage. A first output signal and a second output signal outputted by the second amplification circuit of the data receiving circuit in a previous stage are used as the feedback signals of the next stage data receiving circuit.

In some embodiments, a decision equalization enable circuit of the data receiving circuit in a current stage is connected to an output end of the previous stage latch circuit. A signal outputted by the previous stage latch circuit is used as the feedback signal of the next stage data receiving circuit.

According to some embodiments of the disclosure, still another aspect of an embodiment of the disclosure further provides a storage apparatus, including: a plurality of data ports; and a plurality of data receiving systems described above, each of which corresponds to one data port.

The technical solutions provided in the embodiments of the disclosure have at least the following advantages.

In an aspect, the enable signal has the first level value period, and the level value of the control signal varies with the level value of the feedback signal. It may be understood that, based on different previously received feedback signals, the second amplification circuit may selectively receive one of the first signal pair or the second signal pair based on different control signals, so as to reduce the impact of intersymbol interference of the received data signal on the data receiving circuit. In another aspect, the enable signal has the second level value period, and the level value of the first control signal is the fixed value. It may be understood that, regardless of the level value of the previously received feedback signal, the second amplification circuit only fixedly receives one of the first signal pair or the second signal pair based on the control signal of which level value is the fixed value. That is to say, a circuit configured to output the other of first signal pair or the second signal pair may be in a non-operating state, thereby facilitating the reduction of the power consumption of the data receiving circuit.

Therefore, the decision equalization enable circuit may be used to process the previously received feedback signal to obtain the control signal that may control the second amplification circuit, so as to select whether the impact of the intersymbol interference of data received by the data receiving circuit on the data receiving circuit is considered. For example, when the impact of the intersymbol interference on the data receiving circuit is required to be reduced, the decision equalization enable circuit is used to output the control signal. The control signal may control whichever of the first signal pair or the second signal pair selectively received by the second amplification circuit has a larger difference in level value, so as to ensure that the second amplification circuit receives a pair of differential signals with a larger difference in signal level value. When the impact of the intersymbol interference on the data receiving circuit is not required to be considered, the decision equalization enable circuit is used to output the control signal. The control signal may control the fixed one of the first signal pair or the second signal pair selectively received by the second amplification circuit, so as to achieve an effect of reducing the power consumption of the data receiving circuit while the receiving performance of the data receiving circuit is improved.

BRIEF DESCRIPTION OF THE DRAWINGS

One or more embodiments are exemplified by the figures in the corresponding drawings, and these exemplary descriptions do not constitute limitations of the embodiments. Elements in the drawings with the same reference numerals are represented as similar elements. Unless otherwise stated, the figures in the drawings do not constitute a scale limitation. In order to more clearly illustrate the technical solutions in the embodiments of the disclosure or conventional technologies, the drawings used in the technical description of the embodiments will be briefly described below. It is apparent that the drawings in the following descriptions are merely some embodiments of the disclosure. Other drawings can be obtained from those skilled in the art according to these drawings without any creative work.

DETAILED DESCRIPTION

Embodiments of the disclosure provide a data receiving circuit, a data receiving system and a storage apparatus. In the data receiving circuit, the decision equalization enable circuit may be used to process the previously received feedback signal to obtain the control signal that may control the second amplification circuit, so as to select whether the impact of the intersymbol interference of data received by the data receiving circuit on the data receiving circuit is considered. For example, when the impact of the intersymbol interference on the data receiving circuit is required to be reduced, the decision equalization enable circuit is used to output the control signal. The control signal may control whichever of the first signal pair or the second signal pair selectively received by the second amplification circuit has a larger difference in level value, so as to ensure that the second amplification circuit receives a pair of differential signals with a larger difference in signal level value. When the impact of the intersymbol interference on the data receiving circuit is not required to be considered, the decision equalization enable circuit is used to output the control signal. The control signal may control the fixed one of the first signal pair or the second signal pair selectively received by the second amplification circuit, so as to achieve an effect of reducing the power consumption of the data receiving circuit while the receiving performance of the data receiving circuit is improved.

Embodiments of the disclosure are described in detail below with reference to the drawings. However, it is to be understood by those skilled in the art that, in each embodiment of the disclosure, many technical details are provided for readers to better understand the embodiments of the disclosure. However, even without these technical details and various changes and modifications based on the following embodiments, the technical solutions claimed in the embodiments of the disclosure may also be realized.

Figure 6:
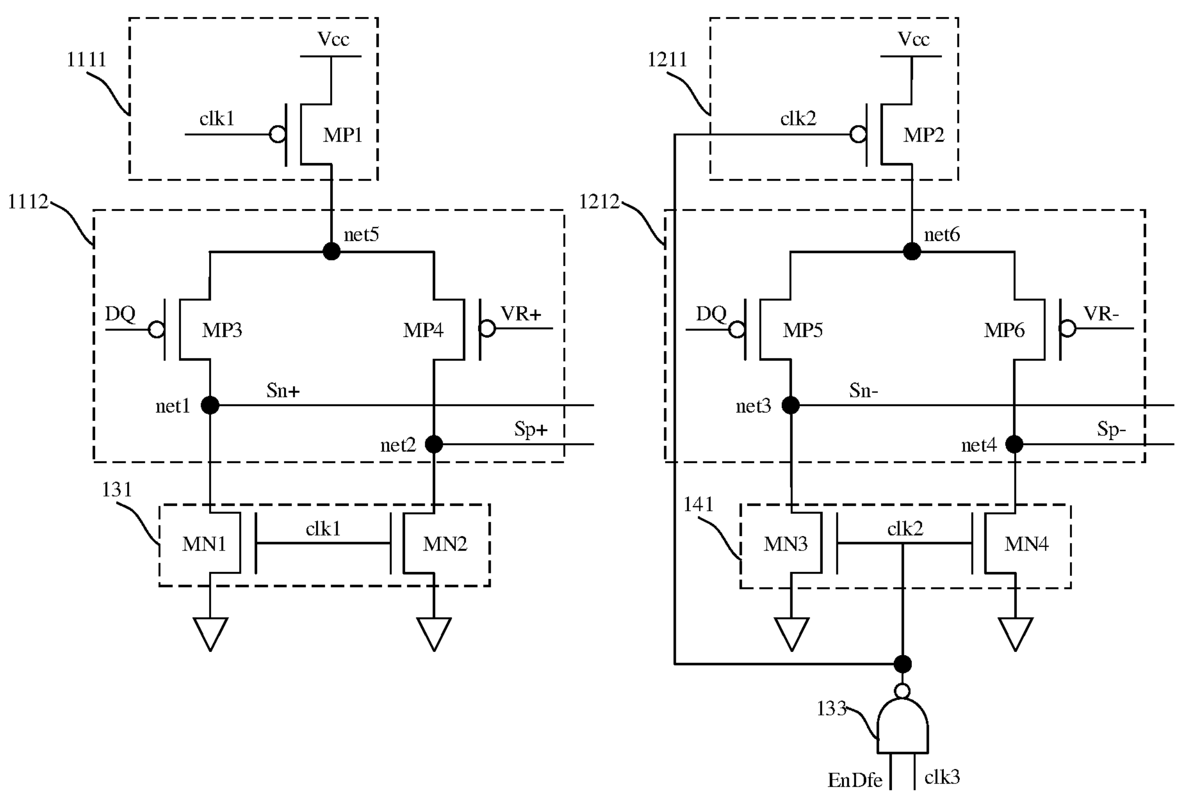
FIG. 6 is a schematic diagram of a circuit structure of a first amplification circuit and a partial decision equalization enable circuit in a data receiving circuit according to an embodiment of the disclosure.
Figure 7:
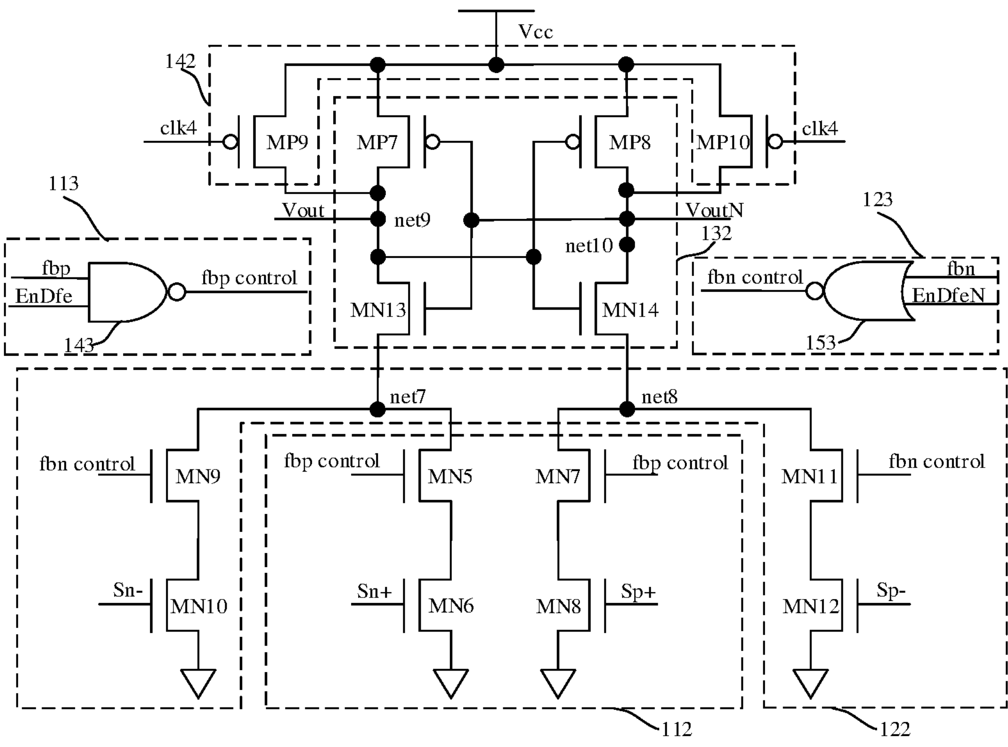
FIG. 7 is a schematic diagram of a circuit structure of a second amplification circuit and a partial decision equalization enable circuit in a data receiving circuit according to an embodiment of the disclosure.

An embodiment of the disclosure provides a data receiving circuit. The data receiving circuit provided in this embodiment of the disclosure is described in detail below with reference to the drawings. FIG. 1 and FIG. 3 to FIG. 5 are four functional block diagrams of a data receiving circuit according to an embodiment of the disclosure. FIG. 6 is a schematic diagram of a circuit structure of a first amplification circuit and a partial decision equalization enable circuit in a data receiving circuit according to an embodiment of the disclosure. FIG. 7 is a schematic diagram of a circuit structure of a second amplification circuit and a partial decision equalization enable circuit in a data receiving circuit according to an embodiment of the disclosure.

Figure 1:
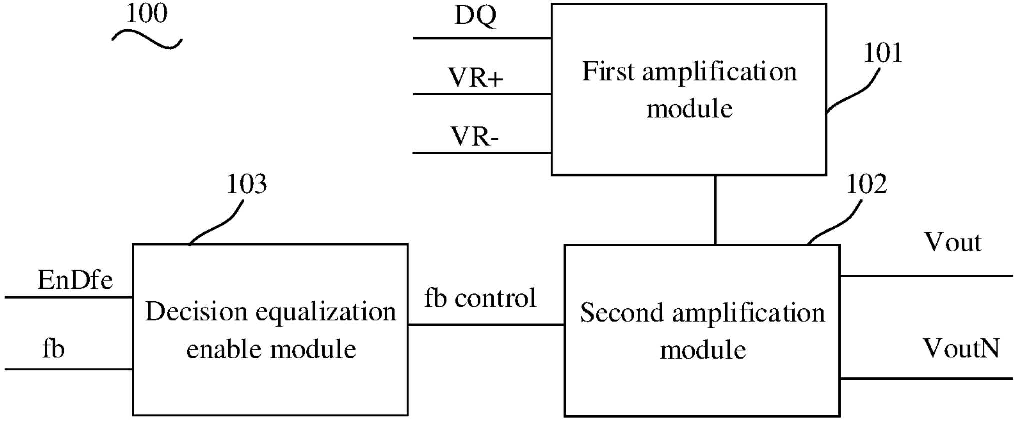
FIG. 1 is a functional block diagram of a data receiving circuit according to an embodiment of the disclosure.
Figure 3:
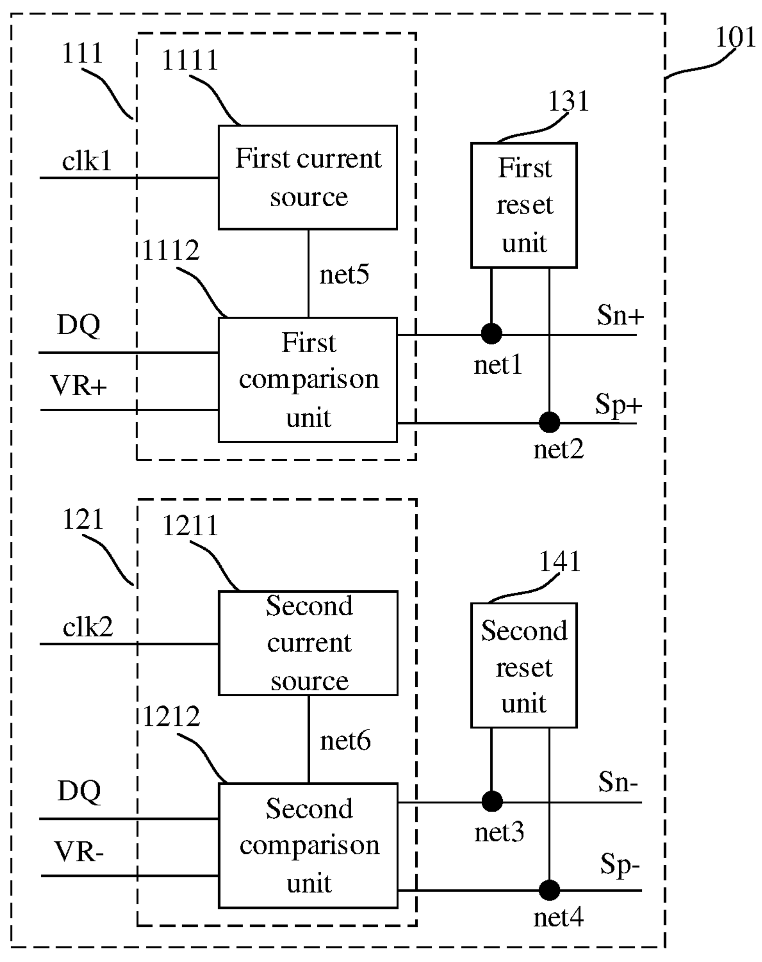
FIGS. 3 to 5 are another three functional block diagrams of a data receiving circuit according to an embodiment of the disclosure.

Referring to FIG. 1 and FIG. 3, the data receiving circuit 100 includes: a first amplification circuit 101, configured to receive a data signal DQ, a first reference signal VR+ and a second reference signal VR−, perform first comparison on the data signal DQ and the first reference signal VR+ to output a first signal pair as a result of the first comparison, perform second comparison on the data signal DQ and the second reference signal VR− to output a second signal pair as a result of the second comparison, where a level value of the first reference signal VR+ is different from a level value of the second reference signal VR−, the first signal pair includes a first signal Sn+ and a second signal Sp+, and the second signal pair includes a third signal Sn− and a fourth signal Sp−; a decision equalization enable circuit 103, configured to receive an enable signal EnDfe and a feedback signal fb, and output a control signal fb control, where the feedback signal fb is obtained based on previously received data, the enable signal EnDfe has a first level value period, a level value of the control signal fb control varies with a level value of the feedback signal fb, the enable signal EnDfe has a second level value period, the level value of the control signal fb control is a fixed value, and a first level value is different from a second level value; and a second amplification circuit 102, configured to selectively receive the first signal pair or the second signal pair as an input signal pair based on the control signal fb control, amplify a voltage difference of the input signal pair, and output a first output signal Vout and a second output signal VoutN as an amplification result.

It may be understood that, the enable signal EnDfe has the first level value period, and the level value of the control signal fb control varies with the level value of the feedback signal fb. Based on different previously received feedback signals fb, the second amplification circuit 102 may selectively receive whichever of the first signal pair or the second signal pair has a larger difference in level value based on different control signals fb control, to ensure that the second amplification circuit 102 receives a pair of differential signals with a larger difference in signal level value, so as to reduce the impact of intersymbol interference of the received data signal on the data receiving circuit 100.

It is to be noted that, the level value of the first reference signal VR+ is different from the level value of the second reference signal VR−. For data signals DQ with different level values, the data signal DQ may have a large difference in the level value from that of one of the first reference signal VR+ or the second reference signal VR−, so that the first amplification circuit 101 can amplify the difference in level value, and the difference in level value of the signal in at least one of the first signal pair and the second signal pair outputted by the first amplification circuit 101 is relatively large. When there is an intersymbol interference phenomenon in the data signal DQ received by the data receiving circuit 100, the second amplification circuit 102 may subsequently receive a pair of signals having a large difference in level value in the first signal pair and the second signal pair based on the control signal fb control. It may be understood that, the data receiving circuit 100 may enhance the ability of the data receiving circuit 100 to adjust the received data signal DQ by using the first reference signal VR+ and the second reference signal VR−. That is to say, when there is an intersymbol interference phenomenon in the data signal DQ received by the data receiving circuit 100, the second amplification circuit 102 receives, based on the control signal fb control, the pair of signals in the first amplification circuit 101 that better process the data signal DQ. The pair of signals that better process the data signal DQ are the pair of signals in the first signal pair and the second signal pair that have a large difference in level value. Therefore, the purpose of reducing the impact of the intersymbol interference of the received data signal DQ on the data receiving circuit 100 can be realized.

In addition, the second amplification circuit 102 selectively receives the one of the first signal pair and the second signal pair that have a large difference in level value based on the control signal fb control, so that the second amplification circuit 102 is guaranteed to receive a pair of differential signals with a larger difference in signal level value. Therefore, the accuracy of the first output signal Vout and the second output signal VoutN outputted by the second amplification circuit 102 can be enhanced. Therefore, through the cooperation of the first amplification circuit 101, the second amplification circuit 102 and the decision equalization enable circuit 103, the receiving performance of the data receiving circuit 100 is improved.

In another aspect, the enable signal EnDfe has the second level value period, and the level value of the first control signal fb control is the fixed value. It may be understood that, regardless of the level value of the previously received feedback signal fb, the second amplification circuit 102 only fixedly receives one of the first signal pair or the second signal pair based on the control signal fb control of which level value is the fixed value. That is to say, a circuit configured to output the other of first signal pair or the second signal pair may be in a non-operating state, thereby facilitating the reduction of the power consumption of the data receiving circuit.

Based on the analysis, it may be learned that, the decision equalization enable circuit 103 may be used to process the previously received feedback signal fb to obtain the control signal fb control that may control the second amplification circuit 102, so as to select whether the impact of the intersymbol interference of data received by the data receiving circuit 100 on the data receiving circuit 100 is considered. Therefore, an effect of reducing the power consumption of the data receiving circuit 100 while the receiving performance of the data receiving circuit 100 is improved.

The way that data receiving circuit 100 reduces the impact of the intersymbol interference of the received data signal DQ on the data receiving circuit 100 is described in detail below with reference to a specific example.

In some embodiments, the level value of the first reference signal VR+ is lower than the level value of the second reference signal VR−. If the data signal DQ is at a low level and there is intersymbol interference in the data signal DQ received by the data receiving circuit 100, the second amplification circuit 102 receives the second signal pair based on the control signal fb control. In this case, the difference in level value between the data signal DQ and the second reference signal VR− is greater than the difference in level value between the data signal DQ and the first reference signal VR+. That is to say, the difference in level value between the signals in the second signal pair is greater than the difference in level value between the signals in the first signal pair. Therefore, the second amplification circuit 102 receives the second signal pair, which facilitates the outputting of the first output signal Vout and the second output signal VoutN that meet requirements, that is, the accuracy of the first output signal Vout and the second output signal VoutN is guaranteed. Therefore, the impact of the intersymbol interference of the received data signal DQ on the data receiving circuit 100 can be reduced.

In addition, if the data signal DQ is at a high level and there is intersymbol interference in the data signal DQ received by the data receiving circuit 100, the second amplification circuit 102 receives the first signal pair based on the control signal fb control. In this case, the difference in level value between the data signal DQ and the first reference signal VR+ is greater than the difference in level value between the data signal DQ and the second reference signal VR−. That is to say, the difference in level value between the signals in the first signal pair is greater than the difference in level value between the signals in the second signal pair. Therefore, the second amplification circuit 102 receives the first signal pair, which facilitates the outputting of the first output signal Vout and the second output signal VoutN that meet requirements, that is, the accuracy of the first output signal Vout and the second output signal VoutN is guaranteed. Therefore, the impact of the intersymbol interference of the received data signal DQ on the data receiving circuit 100 can be reduced.

It may be seen that, in a case that the enable signal EnDfe has the first level value period and the level value of the control signal fb control varies with the level value of the feedback signal fb, through the cooperation of the first amplification circuit 101 and the second amplification circuit 102, and when there is intersymbol interference in the data signal DQ received by the data receiving circuit 100, the second amplification circuit 102 may selectively receive, based on the control signal fb control, the pair of signals in the first amplification circuit 101 that better process the data signal DQ, so as to enhance the accuracy of the first output signal Vout and the second output signal VoutN outputted by the second amplification circuit 102. Therefore, the impact of the intersymbol interference of the received data signal DQ on the data receiving circuit 100 can be reduced.

Figure 4:
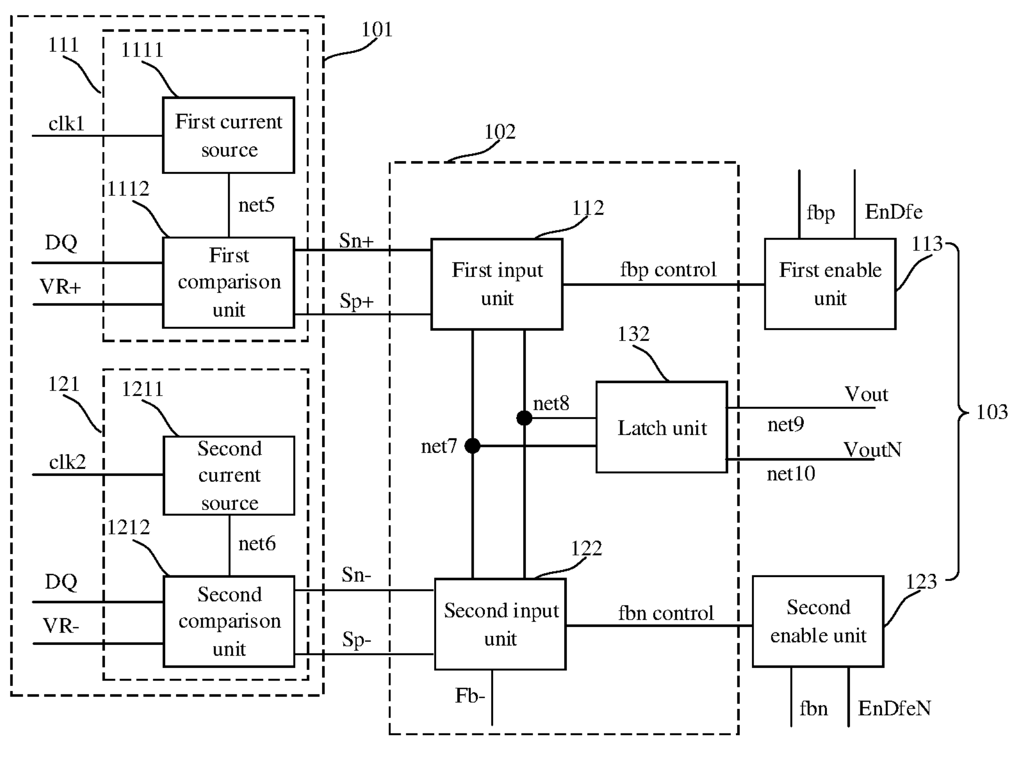
Figure 5:
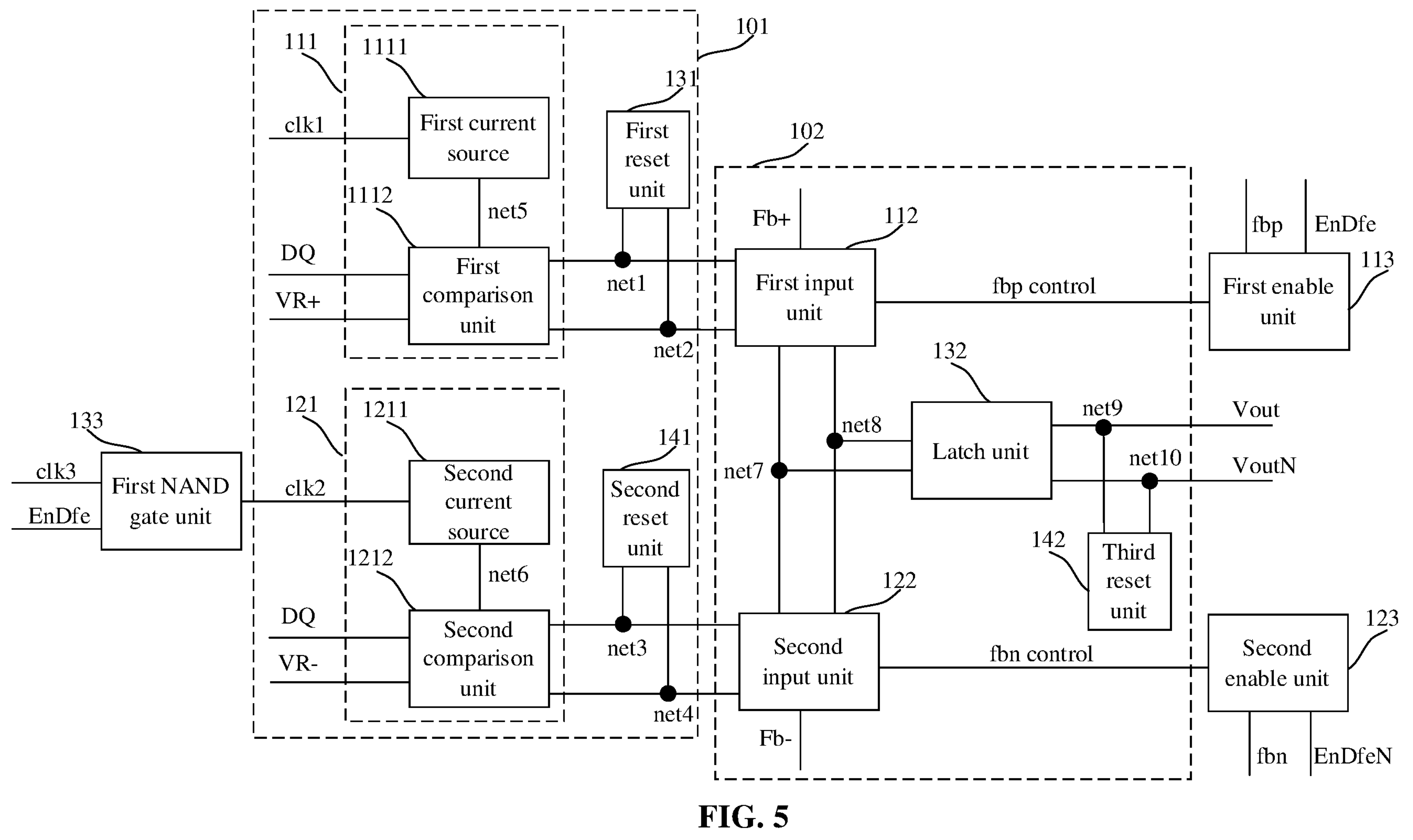

In some embodiments, referring to FIG. 3 to FIG. 5, the first amplification circuit 101 includes: a first comparison circuit 111, having a first node net1 and a second node net2 and configured to receive the data signal DQ and the first reference signal VR+ to perform the first comparison, and respectively output the first signal Sn+ and the second signal Sp+ by using the first node net1 and the second node net2; and a second comparison circuit 121, having a third node net3 and a fourth node net4, and configured to receive the data signal DQ and the second reference signal VR− to perform the second comparison, and respectively output the third signal Sn− and the fourth signal Sp− by using the third node net3 and the fourth node net4.

It may be understood that, the first signal Sn+ and the second signal Sp+ are affected by the data signal DQ and the first reference signal VR+. The third signal Sn− and the fourth signal Sp− are affected by the data signal DQ and the second reference signal VR−. Therefore, when the second amplification circuit 102 receives the first signal pair based on the control signal fb control to output the first output signal Vout and the second output signal VoutN, the first output signal Vout and the second output signal VoutN are affected by the first signal Sn+ and the second signal Sp+. When the second amplification circuit 102 receives the second signal pair based on the control signal fb control to output the first output signal Vout and the second output signal VoutN, the first output signal Vout and the second output signal VoutN are affected by the third signal Sn− and the fourth signal Sp−.

It may be seen that, when the impact of the intersymbol interference on the data receiving circuit 100 is required to be reduced, regardless of the data signal DQ received by the first amplification circuit 101 being at the high level or the low level, one of a difference in level value between the first signal Sn+ and the second signal Sp+ and a difference in level value between the third signal Sn− and the fourth signal Sp− may be larger, so that the second amplification circuit 102 may selectively select the one with a larger voltage difference from the first signal pair and the second signal pair based on the control signal fb control, so as to further adjust the first output signal Vout and the second output signal VoutN affected by the signal pair.

In some embodiments, referring to FIGS. 3 to 5, the first comparison circuit 111 may include: a first current source 1111, configured to be connected between a power node Vcc (referring to FIG. 6) and a fifth node net5, and supply a current to the fifth node net5 in response to a first sampling clock signal clk1; and a first comparison unit 1112, connected to the first node net1, the second node net2 and the fifth node net5, and configured to receive the data signal DQ and the first reference signal VR+, perform the first comparison when the first current source 1111 supplies the current to the fifth node net5, and output the first signal Sn+ and the second signal Sp+. The second comparison circuit 121 may include: a second current source 1211, configured to be connected between the power node Vcc and a sixth node net6, and supply a current to the sixth node net6 in response to a second sampling clock signal clk2; and a second comparison unit 1212, connected to the third node net3, the fourth node net4 and the sixth node net6, and configured to receive the data signal DQ and the second reference signal VR−, perform the second comparison when the second current source 1211 supplies the current to the sixth node net6, and output the third signal Sn− and the fourth signal Sp−.

It may be understood that, based on a voltage difference between the data signal DQ and the first reference signal VR+, the first comparison unit 1112 may control a difference between the current supplied to the first node net1 and the current supplied to the second node net2, so as to output the first signal Sn+ and the second signal Sp+. Based on a voltage difference between the data signal DQ and the second reference signal VR−, the second comparison unit 1212 may control a difference between the current supplied to the third node net3 and the current supplied to the fourth node net4, so as to output the third signal Sn− and the fourth signal Sp−.

In some embodiments, a circuit structure of the first current source 1111 is the same as a circuit structure of the second current source 1211. A circuit structure of the first comparison unit 1112 is the same as a circuit structure of the second comparison unit 1212. In this way, the difference between the first signal pair outputted by the first comparison circuit 111 and the second signal pair outputted by the second comparison circuit 121 is mainly affected by the first reference signal VR+ and the second reference signal VR−, so that the data receiving circuit 100 can further reduce the impact of the intersymbol interference of the received data signal DQ on the data receiving circuit 100 based on the first reference signal VR+ and the second reference signal VR−. Therefore, the accuracy of the first output signal Vout and the second output signal VoutN outputted by the second amplification circuit 102 can be further enhanced.

In some embodiments, referring to FIG. 6, the first current source 1111 may include: a first PMOS transistor MP1, connected between the power node Vcc and the fifth node net5. A gate of the first PMOS transistor MP1 receives the first sampling clock signal clk1. The second current source 1211 includes: a second PMOS transistor MP2, connected between the power node Vcc and the sixth node net6. A gate of the second PMOS transistor MP2 receives the second sampling clock signal clk2. When the first sampling clock signal clk1 is at a low level, the gate of the first PMOS transistor MP1 is turned on by receiving the first sampling clock signal clk1; the current is supplied to the fifth node net5 to cause the first comparison unit 1112 to be in an operating state; and then the first comparison is performed on the received data signal DQ and the first reference signal VR+. When the second sampling clock signal clk2 is at a low level, the gate of the second PMOS transistor MP2 is turned on by receiving the second sampling clock signal clk2; the current is supplied to the sixth node net6 to cause the second comparison unit 1212 to be in an operating state; and then the second comparison is performed on the received data signal DQ and the second reference signal VR−.

It is to be noted that, when the impact of the intersymbol interference on the data receiving circuit is required to be reduced, the first sampling clock signal clk1 and the second sampling clock signal clk2 may be a same clock signal, or may be different clock signals having a same phase but different amplitudes, so that the first PMOS transistor MP1 and the second PMOS transistor MP2 can be turned on at the same time, to cause the first comparison unit 1112 and the second comparison unit 1212 to be in the operating states. Then, the second amplification circuit 102 may selectively receive one of the first signal pair or the second signal pair based on the changed control signal fb control, to reduce the impact of the intersymbol interference of the received data signal DQ on the data receiving circuit 100. In addition, when the impact of the intersymbol interference on the data receiving circuit 100 is not required to be considered, one of the first sampling clock signal clk1 and the second sampling clock signal clk2 is at a fixed high level, and the other one is the clock signal. That is to say, one of the first PMOS transistor MP1 and the second PMOS transistor MP2 is required to be turned off all the time, and the other one is turned on in response to the clock signal, as long as one of the first comparison unit 1112 and the second comparison unit 1212 is in the operating state. Therefore, the power consumption of the data receiving circuit 100 can be reduced.

In some embodiments, referring to FIG. 6, the first comparison unit 1112 may include: a third PMOS transistor MP3, connected between the first node net1 and the fifth node net5, where a gate of the third PMOS transistor MP3 receives the data signal DQ; and a fourth PMOS transistor MP4, connected between the second node net2 and the fifth node net5. A gate of the fourth PMOS transistor MP4 receives the first reference signal VR+. The second comparison unit 1212 may include: a fifth PMOS transistor MP5, connected between the third node net3 and the sixth node net6, where a gate of the fifth PMOS transistor MP5 receives the data signal DQ; and a sixth PMOS transistor MP6, connected between the fourth node net4 and the sixth node net6. A gate of the sixth PMOS transistor MP6 receives the second reference signal VR.

It is to be noted that, for the first comparison unit 1112, the level values of the data signal DQ and the first reference signal VR+ are asynchronous in changing, so that a turning-on moment of the third PMOS transistor MP3 receiving the data signal DQ is different from a turning-on moment of the fourth PMOS transistor MP4 receiving the first reference signal VR+, and at the same moment, a turning-on degree of the third PMOS transistor MP3 is different from a turning-on degree of the fourth PMOS transistor MP4. It may be understood that, since the turning-on degree of the third PMOS transistor MP3 is different from the turning-on degree of the fourth PMOS transistor MP4, the abilities of the third PMOS transistor MP3 and the fourth PMOS transistor MP4 for shunting the current at the fifth node net5 are also different, so that a voltage at the first node net1 is different from a voltage at the second node net2, which facilitates the outputting of the first signal Sn+ and the second signal Sp+ as the first signal pair.

For the second comparison unit 1212, the level values of the data signal DQ and the second reference signal VR− are asynchronous in changing, so that a turning-on moment of the fifth PMOS transistor MP5 receiving the data signal DQ is different from a turning-on moment of the sixth PMOS transistor MP6 receiving the second reference signal VR−, and at the same moment, a turning-on degree of the fifth PMOS transistor MP5 is different from a turning-on degree of the sixth PMOS transistor MP6. It may be understood that, since the turning-on degree of the fifth PMOS transistor MP5 is different from the turning-on degree of the sixth PMOS transistor MP6, the abilities of the fifth PMOS transistor MP5 and the sixth PMOS transistor MP6 for shunting the current at the sixth node net6 are also different, so that a voltage at the third node net3 is different from a voltage at the fourth node net4, which facilitates the outputting of the third signal Sn− and the fourth signal Sp− as the second signal pair.

In an example, when the level value of the data signal DQ is lower than the level value of the first reference signal VR+, the turning-on degree of the third PMOS transistor MP3 is greater than the turning-on degree of the fourth PMOS transistor MP4, to cause more currents at the fifth node net5 to flow into a path where the third PMOS transistor MP3 is located, so that the current at the first node net1 is greater than the current at the second node net2, so as to further achieve a high level value of the first signal Sn+ outputted by the first node net1 and a low level value of the second signal Sp+ outputted by the second node net2. When the level value of the data signal DQ is lower than the level value of the second reference signal VR−, the turning-on degree of the fifth PMOS transistor MP5 is greater than the turning-on degree of the sixth PMOS transistor MP6, to cause more currents at the sixth node net6 to flow into a path where the fifth PMOS transistor MP5 is located, so that the current at the third node net3 is greater than the current at the fourth node net4, so as to further achieve a high level value of the third signal Sn− outputted by the third node net3 and a low level value of the fourth signal Sp− outputted by the fourth node net4.

Likewise, when the level value of the data signal DQ is higher than the level value of the first reference signal VR+, the turning-on degree of the third PMOS transistor MP3 is less than the turning-on degree of the fourth PMOS transistor MP4, so that the level value of the first signal Sn+outputted by the first node net1 is low, and the level value of the second signal Sp+ outputted by the second node net2 is high. When the level value of the data signal DQ is higher than the level value of the second reference signal VR−, a turning-on degree of the fifth PMOS transistor MP5 is less than a turning-on degree of the sixth PMOS transistor MP6, so that the level value of the third signal Sn− outputted by the third node net3 is low, and the level value of the fourth signal Sp− outputted by the fourth node net4 is high.

In some embodiments, referring to FIG. 3 and FIG. 5, the first amplification circuit 101 may further include: a first reset circuit 131, connected to the first node net1 and the second node net2, and configured to reset the first node net1 and the second node net2; and a second reset circuit 141, connected to the third node net3 and the fourth node net4, and configured to reset the third node net3 and the fourth node net4. In this way, after the data receiving circuit 100 completes the receiving of the data signal DQ, the first reference signal VR+ and the second reference signal VR− and the outputting of the first output signal Vout and the second output signal VoutN once, the level values at the first node net1 and the second node net2 may return to initial values by using the first reset circuit 131, and the level values at the third node net3 and the fourth node net4 may return to initial values by using the second reset circuit 141, so that the data receiving circuit 100 can perform data receiving and processing for the next time, subsequently.

In some embodiments, referring to FIG. 6, the first reset circuit 131 includes: a first NMOS transistor MN1, connected between the first node net1 and ground, where a gate of the first NMOS transistor MN1 receives the first sampling clock signal clk1; and a second NMOS transistor MN2, connected between the second node net2 and the ground. A gate of the second NMOS transistor MN2 receives the first sampling clock signal clk1. The second reset circuit 141 may include: a third NMOS transistor MN3, connected between the third node net3 and the ground, where a gate of the third NMOS transistor MN3 receives the second sampling clock signal clk2; and a fourth NMOS transistor MN4, connected between the fourth node net4 and the ground. A gate of the fourth NMOS transistor MN4 receives the second sampling clock signal clk2.

In an example, when the impact of the intersymbol interference on the data receiving circuit is required to be reduced, if both the first sampling clock signal clk1 and the second sampling clock signal clk2 are at low levels, the first PMOS transistor MP1 and the second PMOS transistor MP2 are turned on. In this case, the first NMOS transistor MN1, the second NMOS transistor MN2, the third NMOS transistor MN3 and the fourth NMOS transistor MN4 are all turned off, to guarantee the normal operation of the data receiving circuit 100. In addition, the first NMOS transistor MN1 and the second NMOS transistor MN2 may be used as loads of the first comparison unit 1112, to increase the amplification gain of the first comparison unit 1112. The third NMOS transistor MN3 and the fourth NMOS transistor MN4 may be used as loads of the second comparison unit 1212, to increase the amplification gain of the second comparison unit 1212. If both the first sampling clock signal clk1 and the second sampling clock signal clk2 are at high levels, the first PMOS transistor MP1 and the second PMOS transistor MP2 are turned off, so that there is no current passing through the first comparison unit 1112 and the second comparison unit 1212. In this case, the first NMOS transistor MN1, the second NMOS transistor MN2, the third NMOS transistor MN3 and the fourth NMOS transistor MN4 are all turned on, to pull down the voltage at the first node net1, the voltage at the second node net2, the voltage at the third node net3, and the voltage at the fourth node net4. Therefore, the first node net1, the second node net2, the third node net3, and the fourth node net4 are reset.

Furthermore, when the impact of the intersymbol interference on the data receiving circuit 100 is not required to be considered, if the first sampling clock signal clk1 is at the low level, and the second sampling clock signal clk2 is at the high level, the first PMOS transistor MP1 is turned on, and the second PMOS transistor MP2 is disconnected. In this case, both the first NMOS transistor MN1 and the second NMOS transistor MN2 are turned off, to guarantee the normal operation of the first comparison circuit 111. In addition, both the third NMOS transistor MN3 and the fourth NMOS transistor MN4 are turned on, to pull down the voltage at the third node net3 and the voltage at the fourth node net4, so that the third node net3 and the fourth node net4 are reset, so as to reduce the power consumption of the data receiving circuit 100.

Alternatively, if the first sampling clock signal clk1 is at the high level, and the second sampling clock signal clk2 is at the low level, the first PMOS transistor MP1 is disconnected, and the second PMOS transistor MP2 is turned on. In this case, both the first NMOS transistor MN1 and the second NMOS transistor MN2 are turned on, to pull down the voltage at the first node net1 and the voltage at the second node net2, so that the first node net1 and the second node net2 are reset, so as to reduce the power consumption of the data receiving circuit 100. In addition, the third NMOS transistor MN3 and the fourth NMOS transistor MN4 are disconnected, to guarantee the normal operation of the second comparison circuit 121.

In some embodiments, referring to FIG. 7, the second amplification circuit 102 may include: a first input circuit 112, connected to a seventh node net7 and an eighth node net8, and configured to be turned on in response to the control signal fb control to receive the first signal pair and perform third comparison on the first signal, and separately provide a signal to the seventh node net7 and the eighth node net8 as a result of the third comparison; a second input circuit 122, connected to the seventh node net7 and the eighth node net8, and configured to be turned on in response to the control signal fb control to receive the second signal pair and perform a fourth comparison, and separately provide the signal to the seventh node net7 and the eighth node net8 as a result of the fourth comparison, where the first input circuit 112 and the second input circuit 122 are alternatively turned on based on the control signal fb control; and a latch circuit 132, connected to the seventh node net7 and the eighth node net8, and configured to amplify and latch the signal of the seventh node net7 and the signal of the eighth node net8, and output the first output signal Vout and the second output signal VoutN by using a first output node net9 and a second output node net10.

The latch circuit 132 is configured to output a high level signal to the first output node net9 and output a low level signal to the second output node net10 according to the signal of the seventh node net7 and the signal of the eighth node net8, or to output the low level signal to the first output node net9 and output the high level signal to the second output node net10.

In some embodiments, referring to FIG. 4 and FIG. 5, the feedback signal fb may include a differential first feedback signal fbp and a second feedback signal fbn. The control signal fb control includes a differential first control signal fbp control and a second control signal fbn control. The first input circuit 112 is turned on in response to the first control signal fbp control, and the second input circuit 122 is turned on in response to the second control signal fbn control. The decision equalization enable circuit 103 may include: a first enable circuit 113, configured to receive the enable signal EnDfe and the feedback signal fbp, and output the first control signal fbp control, where the enable signal EnDfe has the first level value period, a level value of the first control signal fbp control varies with a level value of the first feedback signal fbp, the enable signal EnDfe has the second level value period, and the level value of the first control signal fbp control is a fixed value; and a second enable circuit 123, configured to receive a complementary enable signal EnDfeN and the second feedback signal fbn, and output the second control signal fbn control. The complementary enable signal EnDfeN and the enable signal EnDfe are differential signals for each other. The complementary enable signal EnDfeN has the second level value period. A level value of the second control signal fbn control varies with a level value of the second feedback signal fbn. The complementary enable signal EnDfeN has the first level value period, and the level value of the second control signal fbn control is a fixed value.

In an example, when the first control signal fbp control is at a high level, and the second control signal fbn control is at a low level, the first input circuit 112 is turned on in response to the first control signal fbp control. In this case, the second input circuit 122 is disconnected in response to the second control signal fbn control. That is to say, the first output signal Vout and the second output signal VoutN are obtained based on the first signal Sn+ and the second signal Sp+ received by the first input circuit 112. In another example, when the first control signal fbp control is at the low level, and the second control signal fbn control is at the high level, the first input circuit 112 is disconnected in response to the first control signal fbp control. In this case, the second input circuit 122 is turned on in response to the second control signal fbn control. That is to say, the first output signal Vout and the second output signal VoutN are obtained based on the third signal Sn− and the fourth signal Sp− received by the second input circuit 122.

It is to be noted that, in an example, the first level value period of the enable signal EnDfe and the complementary enable signal EnDfeN refers to a level value range in which the first enable circuit 113 determines the enable signal EnDfe to be at a logic level 1 and the second enable signal 123 determines the complementary enable signal EnDfeN to be at the logic level 1, that is, the high level. The second level value period of the enable signal EnDfe and the complementary enable signal EnDfeN refers to a level value range in which the first enable circuit 113 determines the enable signal EnDfe to be at a logic level 0 and the second enable signal 123 determines the complementary enable signal EnDfeN to be at the logic level 0, that is, the low level.

It may be understood that, when the enable signal EnDfe is at the logic level 1 and the complementary enable signal EnDfeN is at the logic level 0, the level value of the first control signal fbp control varies with the level value of the first feedback signal fbp, and the level value of the second control signal fbn control varies with the level value of the second feedback signal fbn. In this case, the first comparison unit 1112 and the second comparison unit 1212 may both be in operating states. Subsequently, the second amplification circuit 102 may selectively receive whichever of the first signal pair or the second signal pair has a larger difference in level value based on the changed control signal fb control, to ensure that the second amplification circuit 102 receives a pair of differential signals with a larger difference in signal level value, so as to reduce the impact of intersymbol interference of the received data signal DQ on the data receiving circuit 100. When the enable signal EnDfe is at the logic level 0 and the complementary enable signal EnDfeN is at the logic level 1, the level value of the first control signal fbp control is the fixed value, and the level value of the second control signal fbn control is the fixed value. In this case, one of the first PMOS transistor MP1 and the second PMOS transistor MP2 may be turned on, to cause one of the first comparison unit 1112 and the second comparison unit 1212 to be in the operating state, so that the second amplification circuit 102 can fixedly receive one of the first signal pair or the second signal pair, so as to reduce the power consumption of the data receiving circuit 100.

It is to be noted that, the decision equalization enable circuit 103 may provide the complementary enable signal EnDfeN to itself based on the received enable signal EnDfe. In the practical application, the complementary enable signal EnDfeN may also be provided to the decision equalization enable circuit 103 by other circuits.

In some embodiments, referring to FIG. 5, the decision equalization enable circuit 103 may further include: a first NAND gate circuit 113, configured to receive the enable signal EnDfe and a third sampling clock signal clk3, and output a second sampling clock signal clk2. A phase of the third sampling clock signal clk3 is opposite to that of a first sampling clock signal clk1.

In an example, when the impact of the intersymbol interference on the data receiving circuit is required to be reduced, the enable signal EnDfe is controlled to be at the logic level 1, and the complementary enable signal EnDfeN is controlled to be at the logic level 0. When the first sampling clock signal clk1 is at the low level, and the third sampling clock signal clk3 is at the high level, the second sampling clock signal clk2 outputted by the first NAND gate circuit 113 is at the low level, and then, the first PMOS transistor MP1 is turned on in response to the current first sampling clock signal clk1, the second PMOS transistor MP2 is turned on in response to the current second sampling clock signal clk2, and in this case, the first NMOS transistor MN1, the second NMOS transistor MN2, the third NMOS transistor MN3 and the fourth NMOS transistor MN4 are all turned off.

When the impact of the intersymbol interference on the data receiving circuit 100 is not required to be considered, the enable signal EnDfe is controlled to be at the logic level 0, the complementary enable signal EnDfeN is controlled to be at the logic level 1, and then the second sampling clock signal clk2 outputted by the first NAND gate circuit 113 is at the high level. Then, the first PMOS transistor MP11 is turned on in response to the current first sampling clock signal clk1, the second PMOS transistor MP2 is disconnected in response to the current second sampling clock signal clk2, and in this case, the third NMOS transistor MN3 and the fourth NMOS transistor MN4 are both turned on, to pull down the voltage at the third node net3 and the voltage at the fourth node net4, so as to reduce the power consumption of the data receiving circuit 100.

In some embodiments, referring to FIG. 7, the first enable circuit 113 may be a second NAND gate circuit 143. The second enable circuit 123 is a NOR gate circuit 153. The first level value is a high level, and the second level value is a low level. The second NAND gate circuit 143 receives the first feedback signal fbp and the enable signal EnDfe. The NOR gate circuit 153 receives the second feedback signal fbn and the complementary enable signal EnDfeN.

In an example, when the impact of the intersymbol interference on the data receiving circuit is required to be reduced, the enable signal EnDfe is at the logic level 1, and the complementary enable signal EnDfeN is at the logic level 0. If the first feedback signal fbp is at the high level, and the second feedback signal fbn is at the low level, then the first control signal fbp control outputted by the second NAND gate circuit 143 is at the low level, and the second control signal fbn control outputted by the NOR gate circuit 153 is at the high level. If the first feedback signal fbp is at the low level, and the second feedback signal fbn is at the high level, then first control signal fbp control outputted by the second NAND gate circuit 143 is at the high level, and the second control signal fbn control outputted by the NOR gate circuit 153 is at the low level. Therefore, the enable signal EnDfe can have the first level value period, and the level value of the first control signal fbp control varies with the level value of the first feedback signal fbp; and the complementary enable signal EnDfeN can have the second level value period, and the level value of the second control signal fbn control varies with the level value of the second feedback signal fbn.

When the impact of the intersymbol interference on the data receiving circuit 100 is not required to be considered, the enable signal EnDfe is at the logic level 0, and the complementary enable signal EnDfeN is at the logic level 1. In this case, regardless of the first feedback signal fbp being at the high level or at the low level and the second feedback signal fbn being at the low level or at the high level, the first control signal fbp control outputted by the second NAND gate circuit 143 is at the high level, and the second control signal fbn control outputted by the NOR gate circuit 153 is at the low level. Therefore, the complementary enable signal EnDfeN can have the second level value period, and the level value of the first control signal fbp control is the fixed value; and the complementary enable signal EnDfeN can have the first level value period, and the level value of the second control signal fbn control is the fixed value.

It is to be noted that, in the practical application, the first enable circuit may be a NOR gate unit. The second enable circuit may be a second NAND gate unit. The first level value is low in level, and the second level value is high in level. The NOR gate circuit receives the first feedback signal and the enable signal. The second NAND gate circuit receives the second feedback signal and the complementary enable signal. In this case, when the impact of the intersymbol interference on the data receiving circuit is required to be reduced, the enable signal EnDfe is at the logic level 0, and the complementary enable signal EnDfeN is at the logic level 1.

In some embodiments, referring to FIG. 7, the first input circuit 112 may include: a fifth NMOS transistor MN5 and a sixth NMOS transistor MN6, where a drain of the fifth NMOS transistor MN5 is connected to the seventh node net7, a source of the fifth NMOS transistor MN5 is connected to a drain of the sixth NMOS transistor MN6, a source of the sixth NMOS transistor MN6 is connected to ground, a gate of the fifth NMOS transistor MN5 receives one of the first signal Sn+ or the first control signal fbp control, and a gate of the sixth NMOS transistor MN6 receives the other of the first signal Sn+ or the first control signal fbp control; and a seventh NMOS transistor MN7 and an eighth NMOS transistor MN8. A drain of the seventh NMOS transistor MN7 is connected to the eighth node net8. A source of the seventh NMOS transistor MN7 is connected to a drain of the eighth NMOS transistor MN8. A source of the eighth NMOS transistor MN8 is connected to the ground. A gate of the seventh NMOS transistor MN7 receives one of the second signal Sp+ or the first control signal fbp control, and a gate of the eighth NMOS transistor MN8 receives the other of the second signal Sp+ or the first control signal fbp control.

The second input circuit 122 may include: a ninth NMOS transistor MN9 and a tenth NMOS transistor MN10, where a drain of the ninth NMOS transistor MN9 is connected to the seventh node net7, a source of the ninth NMOS transistor MN9 is connected to a drain of the tenth NMOS transistor MN10, a source of the tenth NMOS transistor MN10 is connected to the ground, a gate of the ninth NMOS transistor MN9 receives one of the third signal Sn− or the second control signal fbn control, and a gate of the tenth NMOS transistor MN10 receives the other of the third signal Sn− or the second control signal fbn control; and an eleventh NMOS transistor MN11 and a twelfth NMOS transistor MN12. A drain of the eleventh NMOS transistor MN11 is connected to the eighth node net8. A source of the eleventh NMOS transistor MN11 is connected to a drain of the twelfth NMOS transistor MN12. A source of the twelfth NMOS transistor MN12 is connected to the ground. A gate of the eleventh NMOS transistor MN11 receives one of the fourth signal Sp− or the second control signal fbn control, and a gate of the twelfth NMOS transistor MN12 receives the other of the fourth signal Sp− or the second control signal fbn control.

It is to be noted that, in FIG. 7, for example, the gate of the fifth NMOS transistor MN5 receives the first control signal fbp control, the gate of the sixth NMOS transistor MN6 receives the first signal Sn+, the gate of the seventh NMOS transistor MN7 receives the first control signal fbp control, and the gate of the eighth NMOS transistor MN8 receives the second signal Sp+. In the practical application, the gate of the fifth NMOS transistor MN5 may alternatively receive the first signal Sn+, the gate of the sixth NMOS transistor MN6 may alternatively receive the first control signal fbp control, the gate of the seventh NMOS transistor MN7 may alternatively receive the second signal Sp+, and the gate of the eighth NMOS transistor MN8 may alternatively receive the first control signal fbp control. In addition, in FIG. 7, for example, the gate of the ninth NMOS transistor MN9 receives the second control signal fbn control, the gate of the tenth NMOS transistor MN10 receives the third signal Sn−, the gate of the eleventh NMOS transistor MN11 receives the second control signal fbn control, and the gate of the twelfth NMOS transistor MN12 receives the fourth signal Sp−. In the practical application, the gate of the ninth NMOS transistor MN9 may alternatively receive the third signal Sn−, the gate of the tenth NMOS transistor MN10 may alternatively receive the second control signal fbn control, the gate of the eleventh NMOS transistor MN11 may alternatively receive the fourth signal Sp−, and the gate of the twelfth NMOS transistor MN12 may alternatively receive the second control signal fbn control.

In an example, when the level value of the data signal DQ is higher than the level value of the first reference signal VR+, the level value of the first signal Sn+ is low, and the level value of the second signal Sp+ is high. If the first input circuit 112 is currently turned on in response to the first control signal fbp control, the gate of the sixth NMOS transistor MN6 receives the first signal Sn+, and the gate of the eighth NMOS transistor MN8 receives the second signal Sp+, so that a turning-on degree of the eighth NMOS transistor MN8 is greater than a turning-on degree of the sixth NMOS transistor MN6, and the voltage at the eighth node net8 is less than the voltage at the seventh node net7. In this way, a turning-on degree of the fourteenth NMOS transistor MN14 is greater than a turning-on degree of the thirteenth NMOS transistor MN13, the voltage at the second output node net10 is less than the voltage at the first output node net9, and accordingly, a turning-on degree of the eighth PMOS transistor MP8 is less than a turning-on degree of the seventh PMOS transistor MP7. Therefore, the latch circuit 132 forms a positive feedback amplification, to further cause the first output signal Vout outputted by the first output node net9 to be at the high level and cause the second output signal VoutN outputted by the second output node net10 to be at the low level. Likewise, when the level value of the data signal DQ is lower than the level value of the first reference signal VR+, the level value of the first signal Sn+ is high, and the level value of the second signal Sp+ is low. If the first input circuit 112 is currently turned on in response to the first control signal fbp control, the first output signal Vout outputted by the first output node net9 is at the low level, and the second output signal VoutN outputted by the second output node net10 is at the high level.

In an example, when the level value of the data signal DQ is higher than the level value of the second reference signal VR−, the level value of the third signal Sn− is low, and the level value of the fourth signal Sp− is high. If the second input circuit 122 is currently turned on in response to the second control signal fbn control, the gate of the tenth NMOS transistor MN10 receives the third signal Sn−, and the gate of the twelfth NMOS transistor MN12 receives the fourth signal Sp−, so that a turning-on degree of the twelfth NMOS transistor MN12 is greater than a turning-on degree of the tenth NMOS transistor MN10, and the voltage at the eighth node net8 is less than the voltage at the seventh node net7. Therefore, the first output signal Vout outputted by the first output node net9 is at the high level, and the second output signal VoutN outputted by the second output node net10 is at the low level. Likewise, when the level value of the data signal DQ is lower than the level value of the second reference signal VR−, the level value of the third signal Sn− is high, and the level value of the fourth signal Sp− is low. If the second input circuit 122 is currently turned on in response to the second control signal fbn control, the first output signal Vout outputted by the first output node net9 is at the low level, and the second output signal VoutN outputted by the second output node net10 is at the high level.

It is to be noted that, when a plurality of data receiving circuits 100 are cascaded, the feedback signal fb is obtained based on the previously received data, which means that the first output signal Vout and the second output signal VoutN outputted by the data receiving circuit in a previous stage 100 are used as the feedback signal fb of the data receiving circuit 100 in the next stage, and the decision equalization enable circuit 103 in the data receiving circuit 100 in the next stage outputs the control signal fb control based on the feedback signal fb and the enable signal EnDfe, to control the second amplification circuit 102 in the data receiving circuit 100 in the next stage; and the first output signal Vout and the second output signal VoutN outputted by the last stage data receiving circuit 100 are used as the feedback signal fb of the first stage data receiving circuit 100, and the decision equalization enable circuit 103 in the first stage data receiving circuit 100 outputs the control signal fb control based on the feedback signal fb and the enable signal EnDfe, to control the second amplification circuit 102 in the first stage data receiving circuit 100.

Specifically, the first output signal Vout outputted by the first output node net9 of the data receiving circuit 100 in a previous stage is used as the first feedback signal fbp of the data receiving circuit 100 in the next stage. The second output signal VoutN outputted by the second output node net10 of the data receiving circuit 100 in a previous stage is used as the second feedback signal fbn of the data receiving circuit 100 in the next stage. The decision equalization enable circuit 103 in the data receiving circuit 100 in the next stage outputs the first control signal fbp control based on the first feedback signal fbp and the enable signal EnDfe. The decision equalization enable circuit 103 in the data receiving circuit 100 in the next stage outputs the second control signal fbn control based on the second feedback signal fbn and the complementary enable signal EnDfeN. The first output signal Vout outputted by the first output node net9 of the last stage data receiving circuit 100 is used as the first feedback signal fbp of the first stage data receiving circuit 100. The second output signal VoutN outputted by the second output node net10 of the last stage data receiving circuit 100 is used as the second feedback signal fbn of the first stage data receiving circuit 100. The decision equalization enable circuit 103 in the first stage data receiving circuit 100 outputs the first control signal fbp control based on the first feedback signal fbp and the enable signal EnDfe. The decision equalization enable circuit 103 in the first stage data receiving circuit 100 outputs the second control signal fbn control based on the second feedback signal fbn and the complementary enable signal EnDfeN.

It may be understood that, if the first output signal Vout outputted by the first output node net9 of the data receiving circuit 100 in a previous stage is at the high level and the second output signal VoutN outputted by the second output node net10 is at the low level, the first feedback signal fbp received by the data receiving circuit 100 in the next stage is at the high level, and the second feedback signal fbn is at the low level.

When the impact of the intersymbol interference on the data receiving circuit is required to be reduced, if the enable signal EnDfe is at the logic level 1 and the complementary enable signal EnDfeN is at the logic level 0, the first control signal fbp control outputted by the second NAND gate circuit 143 is at the low level, and the second control signal fbn control outputted by the NOR gate circuit 153 is at the high level, so that the first input circuit 112 in the data receiving circuit 100 in the next stage is disconnected in response to the first control signal fbp control, and the second input circuit 122 is turned on in response to the second control signal fbn control.

If the first output signal Vout outputted by the first output node net9 of the data receiving circuit 100 in a previous stage is at the low level and the second output signal VoutN outputted by the second output node net10 is at the high level, the first feedback signal fbp received by the data receiving circuit 100 in the next stage is at the low level, and the second feedback signal fbn is at the high level.

When the impact of the intersymbol interference on the data receiving circuit is required to be reduced, if the enable signal EnDfe is at the logic level 1 and the complementary enable signal EnDfeN is at the logic level 0, the first control signal fbp control outputted by the second NAND gate circuit 143 is at the high level, and the second control signal fbn control outputted by the NOR gate circuit 153 is at the low level, so that the first input circuit 112 in the data receiving circuit 100 in the next stage is turned on in response to the first control signal fbp control, and the second input circuit 122 is disconnected in response to the second control signal fbn control.

In some embodiments, referring to FIG. 7, the latch circuit 132 may include: a thirteenth NMOS transistor MN13 and a seventh PMOS transistor MP7, where a gate of the thirteenth NMOS transistor MN13 and a gate of the seventh PMOS transistor MP7 are connected to the first output node net9, a source of the thirteenth NMOS transistor MN13 is connected to the seventh node net7, a drain of the thirteenth NMOS transistor MN13 and a drain of the seventh PMOS transistor MP7 are connected to the second output node net10, and a source of the seventh PMOS transistor MP7 is connected to a power node Vcc; and a fourteenth NMOS transistor MN14 and an eighth PMOS transistor MP8. A gate of the fourteenth NMOS transistor MN14 and a gate of the eighth PMOS transistor MP8 are connected to the second output node net10. A source of the fourteenth NMOS transistor MN14 is connected to the eighth node net8. A drain of the fourteenth NMOS transistor MN14 and a drain of the eighth PMOS transistor MP8 are connected to the first output node net9. A source of the eighth PMOS transistor MP8 is connected to the power node Vcc.

In some embodiments, continuously referring to FIG. 7, the second amplification circuit 102 may further include: a third reset circuit 142, connected between a power node Vcc and an output end of the latch circuit 132, and configured to reset the output end of the latch circuit 132. In this way, after the data receiving circuit 100 completes the receiving of the data signal DQ, the first reference signal VR+ and the second reference signal VR− and the outputting of the first output signal Vout and the second output signal VoutN once, the level values at the first output node net9 and the second output node net10 may return to initial values by using the third reset circuit 142, so that the data receiving circuit 100 can perform data receiving and processing for the next time, subsequently.

In some embodiments, continuously referring to FIG. 7, the third reset circuit 142 may include: a ninth PMOS transistor MP9, connected between the first output node net9 and a power node Vcc, where a gate of the ninth PMOS transistor MP9 receives a fourth sampling clock signal clk4; and a tenth PMOS transistor MP10, connected between the second output node net10 and the power node Vcc. A gate of the tenth PMOS transistor MP10 receives the fourth sampling clock signal clk4.

It is to be noted that, the fourth sampling clock signal clk4 and the third sampling clock signal clk3 may be a same clock signal, or may be different clock signals having a same phase but different amplitudes. A phase of the third sampling clock signal clk3 is opposite to that of the first sampling clock signal clk1.

In an example, referring to FIG. 6 and FIG. 7, when the impact of the intersymbol interference on the data receiving circuit is required to be reduced, the enable signal EnDfe is at the logic level 1, and the complementary enable signal EnDfeN is at the logic level 0. If the first sampling clock signal clk1 is at the low level, and the third sampling clock signal clk3 and the fourth sampling clock signal clk4 are both at the high level, the second sampling clock signal clk2 is at the low level, so that the first PMOS transistor MP1 and the second PMOS transistor MP2 are turned on, and the first NMOS transistor MN1, the second NMOS transistor MN2, the third NMOS transistor MN3, the fourth NMOS transistor MN4, the ninth PMOS transistor MP9, and the tenth PMOS transistor MP10 are all turned off. If the first sampling clock signal clk1 is at the high level, and the third sampling clock signal clk3 and the fourth sampling clock signal clk4 are both at the low level, the second sampling clock signal clk2 is at the high level, so that the first PMOS transistor MP1 and the second PMOS transistor MP2 are turned off. In this case, the first NMOS transistor MN1, the second NMOS transistor MN2, the third NMOS transistor MN3 and the fourth NMOS transistor MN4 are all turned on, and the ninth PMOS transistor MP9 and the tenth PMOS transistor MP10 are also turned on, to pull up the voltage at the first output node net9 and the voltage at the second output node net10, so as to reset the first output node net9 and the voltage at the second output node net10.

When the impact of the intersymbol interference on the data receiving circuit 100 is not required to be considered, the enable signal EnDfe is at the logic level 0, and the complementary enable signal EnDfeN is at the logic level 1. In this case, regardless of the third sampling clock signal clk3 being at the high level or at the low level, the second sampling clock signal clk2 is always at the high level, so that the second PMOS transistor MP2 is always turned off, and the third NMOS transistor MN3 and the fourth NMOS transistor MN4 are turned on, so as to reduce the current in the second comparison circuit 121. Therefore, the power consumption of the data receiving circuit 100 can be reduced.

A specific operating principle of the data receiving circuit 100 provided in an embodiment of the disclosure is described in detail below with reference to FIG. 7 and Table 1.

In an example, when the plurality of data receiving circuits 100 are cascaded, the first output signal Vout outputted by the first output node net9 of the data receiving circuit 100 in a previous stage is used as the first feedback signal fbp of the data receiving circuit 100 in the next stage. The second output signal VoutN outputted by the second output node net10 of the data receiving circuit 100 in a previous stage is used as the second feedback signal fbn of the data receiving circuit 100 in the next stage. The decision equalization enable circuit 103 in the data receiving circuit 100 in the next stage outputs the first control signal fbp control based on the first feedback signal fbp and the enable signal EnDfe. The decision equalization enable circuit 103 in the data receiving circuit 100 in the next stage outputs the second control signal fbn control based on the second feedback signal fbn and the complementary enable signal EnDfeN.

That the level value of the first reference signal VR+ is less than the level value of the second reference signal VR− is used as an example for description below. In an example, the level value of the first reference signal VR+ may be 0.3V, and the level value of the second reference signal VR− may be 0.7V. When the data signal DQ is at the logic level 1, it represents that the level value of the data signal DQ is greater than the level value of the second reference signal VR−. When the data signal DQ is at the logic level 0, it represents that the level value of the data signal DQ is less than the level value of the first reference signal VR+.

It is to be noted that, in Table 1, 1 represents a high level, and 0 represents a low level.

When the impact of the intersymbol interference on the data receiving circuit is required to be reduced, the enable signal EnDfe is at the logic level 1, and the complementary enable signal EnDfeN is at the logic level 0.

Referring to Table 1, if the data signal DQ1 received by the data receiving circuit 100 in a previous stage is at the logic level 1, the first output signal Vout outputted by the data receiving circuit 100 in a previous stage, that is, the first feedback signal fbp of the data receiving circuit 100 in the next stage is at the high level, and the second output signal VoutN outputted by the data receiving circuit 100 in a previous stage, that is, the second feedback signal fbn of the data receiving circuit 100 in the next stage is at the low level, the first control signal fbp control outputted by the second NAND gate circuit 143 is at the low level, and the second control signal fbn control outputted by the NOR gate circuit 153 is at the high level. In this case, the gate of the fifth NMOS transistor MN5 and the gate of the seventh NMOS transistor MN7 are disconnected by receiving the first control signal fbp control, and the gate of the ninth NMOS transistor MN9 and the gate of the eleventh NMOS transistor MN11 are turned on by receiving the second control signal fbn control. The second input circuit 122 is configured to compare the third signal Sn− with the fourth signal Sp−, to provide a signal to the seventh node net7 and the eighth node net8. There is no current flowing through the first input circuit 112.

When the data signal DQ1 received by the data receiving circuit 100 in a previous stage is at the logic level 1, the data signal DQ2 received by the data receiving circuit 100 in the next stage is in the following two situations, respectively.

Situation I: Referring to Table 1, when the data signal DQ2 received by the data receiving circuit 100 in the next stage is at the logic level 0, the difference in the level value between the data signal DQ2 and the data signal DQ1 received by the data receiving circuit 100 in a previous stage is relatively large, so that there is large intersymbol interference. In this case, the second input circuit 122 in the data receiving circuit 100 in the next stage is turned on. That is to say, the second amplification circuit 102 in the data receiving circuit 100 in the next stage receives the third signal Sn− and the fourth signal Sp−. In the data receiving circuit 100 in the next stage, the data signal DQ2 is at the logic level 0, a voltage difference between the data signal DQ2 and the second reference signal VR− is greater than a voltage difference between the data signal DQ2 and the first reference signal VR+, so that the difference in the level value between the signals in the second signal pair processed by the second comparison circuit 121 is larger. In this case, the outputting accuracy of the first output signal Vout and the second output signal VoutN can be higher when the second amplification circuit 102 receives the second signal pair, thereby achieving the purpose of reducing the impact of the intersymbol interference of the received data signal DQ on the data receiving circuit 100.

Situation II: Referring to Table 1, when the data signal DQ2 received by the data receiving circuit 100 in the next stage is at the logic level 1, the difference in the level value between the data signal DQ2 and the data signal DQ1 received by the data receiving circuit 100 in a previous stage is relatively small, so that there is small or no intersymbol interference. In this case, the second input circuit 122 in the data receiving circuit 100 in the next stage is turned on, and the second signal pair outputted by the second comparison circuit 121 in the data receiving circuit 100 in the next stage is received by the second amplification circuit 102.

Referring to Table 1, if the data signal DQ1 received by the data receiving circuit 100 in a previous stage is at the logic level 0, the first output signal Vout outputted by the data receiving circuit 100 in a previous stage, that is, the first feedback signal fbp of the data receiving circuit 100 in the next stage is at the low level, and the second output signal VoutN outputted by the data receiving circuit 100 in a previous stage, that is, the second feedback signal fbn of the data receiving circuit 100 in the next stage is at the high level, the first control signal fbp control outputted by the second NAND gate circuit 143 is at the high level, and the second control signal fbn control outputted by the NOR gate circuit 153 is at the low level. In this case, the gate of the fifth NMOS transistor MN5 and the gate of the seventh NMOS transistor MN7 are turned on by receiving the first control signal fbp control, and the gate of the ninth NMOS transistor MN9 and the gate of the eleventh NMOS transistor MN11 are disconnected by receiving the second control signal fbn control. The first input circuit 112 is configured to compare the first signal Sn+ with the second signal Sp+, to provide the signal to the seventh node net7 and the eighth node net8. There is no current flowing through the second input circuit 122.

When the data signal DQ1 received by the data receiving circuit 100 in a previous stage is at the logic level 0, the data signal DQ2 received by the data receiving circuit 100 in the next stage is in the following two situations, respectively.

Situation III: Referring to Table 1, when the data signal DQ2 received by the data receiving circuit 100 in the next stage is at the logic level 0, the difference in the level value between the data signal DQ2 and the data signal DQ1 received by the data receiving circuit 100 in a previous stage is relatively small, so that there is small or no intersymbol interference. In this case, the first input circuit 112 in the data receiving circuit 100 in the next stage is turned on, and the first signal pair outputted by the first comparison circuit 111 in the data receiving circuit 100 in the next stage is received by the second amplification circuit 102.

Situation IV: Referring to Table 1, when the data signal DQ2 received by the data receiving circuit 100 in the next stage is at the logic level 1, the difference in the level value between the data signal DQ2 and the data signal DQ1 received by the data receiving circuit 100 in a previous stage is relatively large, so that there is large intersymbol interference. In this case, the first input circuit 112 in the data receiving circuit 100 in the next stage is turned on. That is to say, the second amplification circuit 102 in the data receiving circuit 100 in the next stage receives the first signal Sn+ with the second signal Sp+. In this case, in the data receiving circuit 100 in the next stage, the data signal DQ2 is at the logic level 1, a voltage difference between the data signal DQ2 and the first reference signal VR+ is greater than a voltage difference between the data signal DQ2 and the second reference signal VR−, so that the difference in the level value between the signals in the first signal pair processed by the first comparison circuit 111 is larger. In this case, the outputting accuracy of the first output signal Vout and the second output signal VoutN can be higher when the second amplification circuit 102 receives the first signal pair, thereby achieving the purpose of reducing the impact of the intersymbol interference of the received data signal DQ on the data receiving circuit 100.

TABLE 1

| Data signal DQ1 received by previous stage data transmission circuit | Data signal DQ2 received by next stage data transmission circuit | First feedback signal fbp received by previous stage data transmission circuit | Second feedback signal fbn received by previous stage data transmission circuit | First control signal fbp control received by next stage data transmission circuit | Second control signal fbn control received by next stage data transmission circuit | Signal pair received by second amplification circuit in next stage data transmission circuit |
|---|---|---|---|---|---|---|
| 1 | 0 | 1 | 0 | 0 | 1 | Sn−, Sp− |
| 1 | 1 | 1 | 0 | 0 | 1 | Sn−, Sp− |
| 0 | 0 | 0 | 1 | 1 | 0 | Sn+, Sp+ |
| 0 | 1 | 0 | 1 | 1 | 0 | Sn+, Sp+ |

It is to be noted that, in the above description of the high level and the low level, the high level may be a level value that is greater than or equal to a supply voltage, and the low level may be a level value that is less than or equal to a grounding voltage. However, the high level and the low level are relative. Specifically level value ranges included in the high level and the low level may be determined according to specific devices. For example, for an NMOS transistor, the high level refers to the level value range of a gate voltage that can turn on the NMOS transistor, and the low level refers to the level value range of a gate voltage that can turn off the NMOS transistor. For a PMOS transistor, the low level refers to the level value range of a gate voltage that can turn on the PMOS transistor, and the high level refers to the level value range of a gate voltage that can turn off the PMOS transistor.

To sum up, the decision equalization enable circuit 103 may be used to process the previously received feedback signal fb to obtain the control signal fb control that may control the second amplification circuit 102, so as to select whether the impact of the intersymbol interference of data received by the data receiving circuit 100 on the data receiving circuit 100 is considered. For example, when the impact of the intersymbol interference on the data receiving system is required to be reduced, the decision equalization enable circuit 103 is used to output the control signal fb control. The control signal fb control may control whichever of the first signal pair or the second signal pair selectively received by the second amplification circuit 102 has a larger difference in level value, so as to ensure that the second amplification circuit 102 receives a pair of differential signals with a larger difference in signal level value. When the impact of the intersymbol interference on the data receiving system is not required to be considered, the decision equalization enable circuit 103 is used to output the control signal fb control. The control signal fb control may control one of the first signal pair or the second signal pair fixedly received by the second amplification circuit 102, so as to achieve an effect of reducing the power consumption of the data receiving circuit 100 while the receiving performance of the data receiving circuit 100 is improved.

Figure 2:
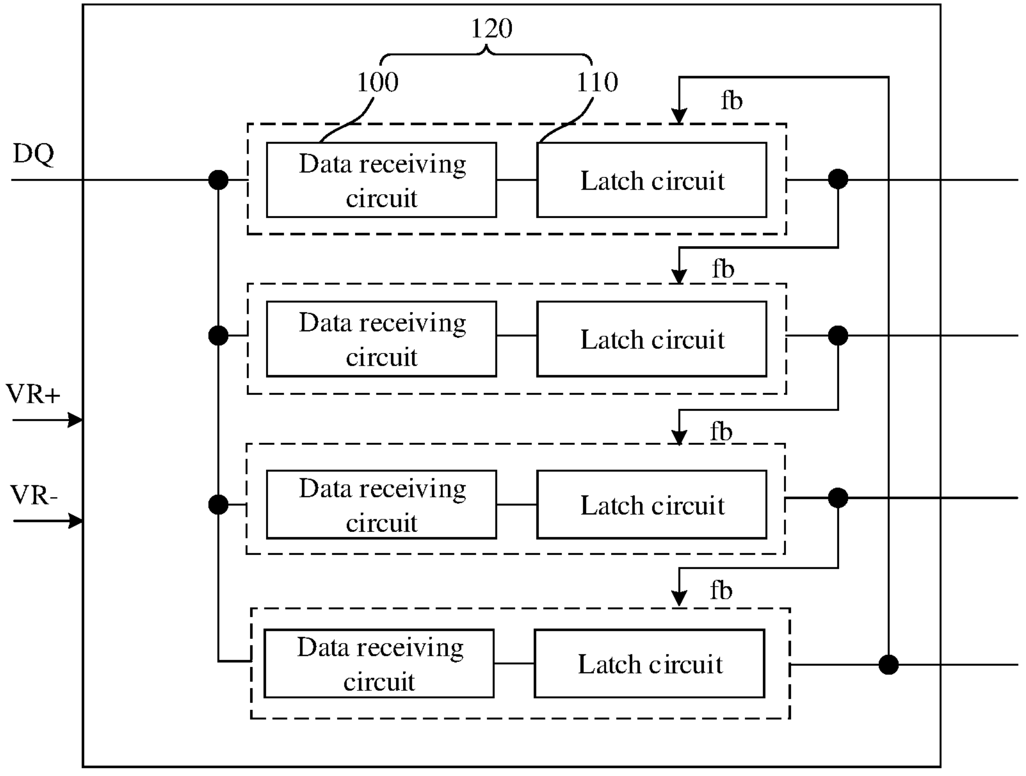
FIG. 2 is a functional block diagram of a data receiving system according to another embodiment of the disclosure.

Another embodiment of the disclosure further provides a data receiving system. The data receiving system provided in another embodiment of the disclosure is described in detail below with reference to the drawings. FIG. 2 is a functional block diagram of a data receiving system according to another embodiment of the disclosure.

Referring to FIG. 2, the data receiving system includes: a plurality of cascaded data transmission circuits 120, each of which includes the data receiving circuit 100 provided in an embodiment of the disclosure and a latch circuit 110 connected to the data receiving circuit 100. An output signal of the data transmission circuit 120 in a previous stage is used as a feedback signal fb of the data transmission circuit 120 in a next stage. An output signal of the data transmission circuit 120 in a last stage is used as a feedback signal fb of the data transmission circuit 120 in a first stage.

The latch circuit 110 is in one-to-one correspondence with the data receiving circuit 100. The latch circuit 110 is configured to latch and output a signal outputted by the data receiving circuit 100 corresponding to the latch circuit 110.

In some embodiments, the data receiving circuit 100 receives data in response to a sampling clock signal. The data receiving system includes 4 cascaded data receiving circuits 100, and a phase difference between the sampling clock signals clkN of the adjacent stage data receiving circuits 100 is 90°. Therefore, a period of the sampling clock signal clkN is 2 times of the period of the data signal DQ received by a data port, which facilitates clock wiring and reduction of power consumption.

It is to be noted that, in FIG. 2, for example, the data receiving system includes 4 cascaded data receiving circuits 100, and the phase difference between the sampling clock signals of the adjacent stage data receiving circuits 100 is 90°. In the practical application, the number of the cascaded data receiving circuits 100 included in the data receiving system is not limited, and a phase difference between the sampling clock signals of the adjacent stage data receiving circuits 100 may be reasonably set based on the number of the cascaded data receiving circuits 100.

In some embodiments, the decision equalization enable circuit 103 (referring to FIG. 1) of the data receiving circuit 100 in a current stage is connected to an output end of the second amplification circuit 102 of the data receiving circuit 100 in a previous stage. The first output signal Vout and the second output signal VoutN outputted by the second amplification circuit 102 of the data receiving circuit 100 in a previous stage are used as the feedback signals fb of the data receiving circuit 100 in the next stage. Therefore, the output of the data receiving circuit 100 is directly transmitted to the data transmission circuit 120 in a next stage without passing through the latch circuit 110, so that the transmission delay of data can be reduced.

In some other embodiments, the decision equalization enable circuit 103 of the data receiving circuit 100 in a current stage is connected to an output end of the latch circuit 110 in the previous stage. A signal outputted by the latch circuit 110 in the previous stage is used as the feedback signal fb of the data receiving circuit 100 in the next stage.

To sum up, according to the data receiving system provided in another embodiment of the disclosure, the decision equalization enable circuit 103 may be used to process the previously received feedback signal fb to obtain the control signal fb control that may control the second amplification circuit 102, so as to select whether the impact of the intersymbol interference of data received by the data receiving circuit 100 on the data receiving circuit 100 is considered. Therefore, when the impact of the intersymbol interference on the data receiving circuit 100 is required to be reduced, the decision equalization enable circuit 103 is used to output the control signal fb control. The control signal fb control may control whichever of the first signal pair or the second signal pair selectively received by the second amplification circuit 102 has a larger difference in level value, to ensure that the second amplification circuit 102 receives a pair of differential signals with a larger difference in signal level value, so as to enhance the accuracy of the first output signal Vout and the second output signal VoutN outputted by the second amplification circuit 102. Therefore, the receiving performance of the data receiving system can be improved. When the impact of the intersymbol interference on the data receiving circuit 100 is not required to be considered, the decision equalization enable circuit 103 is used to output the control signal fb control. The control signal fb control may control one of the first signal pair or the second signal pair fixedly received by the second amplification circuit 102, so as to reduce the power consumption of the data receiving system.

Still another embodiment of the disclosure further provides a storage apparatus, including: a plurality of data ports; and a plurality of data receiving systems provided in another embodiment of the disclosure, each of which corresponds to one data port. Therefore, when the impact of the intersymbol interference on the storage apparatus is required to be reduced, each data port in the storage apparatus may flexibly adjust the received data signal DQ by using the data receiving system, and improve the ability to adjust the first output signal Vout and the second output signal VoutN, so that the receiving performance of the storage apparatus can be improved. When the impact of the intersymbol interference on the storage apparatus is not required to be considered, the decision equalization enable circuit 103 is used to output the control signal fb control that may control the fixed one of the first signal pair or the second signal pair selectively received by the second amplification circuit 102. Therefore, the power consumption of the storage apparatus can be reduced.

In some embodiments, the storage apparatus may be a DDR memory, such as a DDR4 memory, a DDR5 memory, a DDR6 memory, an LPDDR4 memory, an LPDDR5 memory, or an LPDDR6 memory.

Those of ordinary skill in the art may understand that the above implementations are specific examples for realizing the disclosure, and in practical application, various changes may be made in form and details without departing from the spirit and the scope of the embodiments of the disclosure. Any person skilled in the art may make respective changes and modifications without departing from the spirit and scope of the embodiments of the disclosure. Therefore, the protection scope of the embodiments of the disclosure should be subject to the scope defined by the claims.

The invention claimed is:

1. A data receiving circuit, comprising:

a first amplification circuit, configured to receive a data signal, a first reference signal and a second reference signal, perform first comparison on the data signal and the first reference signal to output a first signal pair as a result of the first comparison, and perform second comparison on the data signal and the second reference signal to output a second signal pair as a result of the second comparison, wherein a level value of the first reference signal is different from a level value of the second reference signal, the first signal pair comprises a first signal and a second signal, and the second signal pair comprises a third signal and a fourth signal;

a decision equalization enable circuit, configured to receive an enable signal and a feedback signal, and output a control signal, wherein the feedback signal is obtained based on previously received data, the enable signal has a first level value period, a level value of the control signal varies with a level value of the feedback signal, the enable signal has a second level value period, the level value of the control signal is a fixed value, and a first level value is different from a second level value; and a second amplification circuit, configured to selectively receive the first signal pair or the second signal pair as an input signal pair based on the control signal, amplify a voltage difference of the input signal pair, and output a first output signal and a second output signal as a result of the amplification;

wherein the second amplification circuit comprises:

a first input circuit, connected to a seventh node and an eighth node, and configured to be turned on in response to the control signal to receive the first signal pair and perform a third comparison, and provide a signal to the seventh node and the eighth node respectively as a result of the third comparison;

a second input circuit, connected to the seventh node and the eighth node, and configured to be turned on in response to the control signal to receive the second signal pair and perform a fourth comparison, and provide a signal to the seventh node and the eighth node respectively as a result of the fourth comparison, wherein the first input circuit and the second input circuit are alternatively turned on based on the control signal; and a latch circuit, connected to the seventh node and the eighth node, and configured to amplify and latch the signal of the seventh node and the signal of the eighth node, and output the first output signal and the second output signal via a first output node and a second output node;

wherein the feedback signal comprises a differential first feedback signal and second feedback signal; the control signal comprises a differential first control signal and second control signal; the first input circuit is turned on in response to the first control signal, and the second input circuit is turned on in response to the second control signal; and the decision equalization enable circuit comprises:

a first enable circuit, configured to receive the enable signal and the feedback signal, and output the first control signal, wherein the enable signal has the first level value period, a level value of the first control signal varies with a level value of the first feedback signal, the enable signal has the second level value period, and the level value of the first control signal is a fixed value; and a second enable circuit, configured to receive a complementary enable signal and the second feedback signal, and output the second control signal, wherein the complementary enable signal and the enable signal are differential signals for each other, the complementary enable signal has the second level value period, a level value of the second control signal varies with a level value of the second feedback signal, the complementary enable signal has the first level value period, and the level value of the second control signal is a fixed value.

2. The data receiving circuit of claim 1, wherein the first amplification circuit comprises:

a first comparison circuit, having a first node and a second node and configured to receive the data signal and the first reference signal and perform the first comparison on the data signal and the first reference signal, and output the first signal and the second signal via the first node and the second node respectively; and a second comparison circuit, having a third node and a fourth node and configured to receive the data signal and the second reference signal and perform the second comparison on the data signal and the second reference signal, and output the third signal and the fourth signal via the third node and the fourth node respectively.

3. The data receiving circuit of claim 2, wherein the first comparison circuit comprises:

a first current source connected between a power node and a fifth node for supplying a current to the fifth node in response to a first sampling clock signal; and a first comparison unit, connected to the first node, the second node and the fifth node, and configured to receive the data signal and the first reference signal, perform the first comparison when the first current source supplies the current to the fifth node, and output the first signal and the second signal; and the second comparison circuit comprises:

a second current source connected between the power node and a sixth node for supplying a current to the sixth node in response to a second sampling clock signal; and a second comparison unit, connected to the third node, the fourth node and the sixth node, and configured to receive the data signal and the second reference signal, perform the second comparison when the second current source supplies the current to the sixth node, and output the third signal and the fourth signal.

4. The data receiving circuit of claim 3, wherein the first current source comprises:

a first PMOS transistor, connected between the power node and the fifth node, wherein a gate of the first PMOS transistor receives the first sampling clock signal; and the second current source comprises:

a second PMOS transistor, connected between the power node and the sixth node, wherein a gate of the second PMOS transistor receives the second sampling clock signal.

5. The data receiving circuit of claim 3, wherein the first comparison circuit unit comprises:

a third PMOS transistor, connected between the first node and the fifth node, wherein a gate of the third PMOS transistor receives the data signal; and a fourth PMOS transistor, connected between the second node and the fifth node, wherein a gate of the fourth PMOS transistor receives the first reference signal; and the second comparison unit comprises:

a fifth PMOS transistor, connected between the third node and the sixth node, wherein a gate of the fifth PMOS transistor receives the data signal; and a sixth PMOS transistor, connected between the fourth node and the sixth node, wherein a gate of the sixth PMOS transistor receives the second reference signal.

6. The data receiving circuit of claim 3, wherein the first amplification circuit further comprises:

a first reset circuit, connected to the first node and the second node and configured to reset the first node and the second node; and a second reset circuit, connected to the third node and the fourth node and configured to reset the third node and the fourth node.

7. The data receiving circuit of claim 6, wherein the first reset circuit comprises:

a first NMOS transistor, connected between the first node and ground, wherein a gate of the first NMOS transistor receives the first sampling clock signal; and a second NMOS transistor, connected between the second node and the ground, wherein a gate of the second NMOS transistor receives the first sampling clock signal; and the second reset circuit comprises:

a third NMOS transistor, connected between the third node and the ground, wherein a gate of the third NMOS transistor receives the second sampling clock signal; and a fourth NMOS transistor, connected between the fourth node and the ground, wherein a gate of the fourth NMOS transistor receives the second sampling clock signal.

8. The data receiving circuit of claim 1, wherein the decision equalization enable circuit further comprises: a first NAND gate circuit, configured to receive the enable signal and a third sampling clock signal, and output a second sampling clock signal, wherein a phase of the third sampling clock signal is opposite to that of a first sampling clock signal.

9. The data receiving circuit of claim 1, wherein the first enable circuit is a second NAND gate unit; the second enable circuit is a NOR gate unit; the first level value is a high level, and the second level value is a low level; the second NAND gate circuit receives the first feedback signal and the enable signal; and the NOR gate circuit receives the second feedback signal and the complementary enable signal.

10. The data receiving circuit of claim 1, wherein the first input circuit comprises:

a fifth NMOS transistor and a sixth NMOS transistor, wherein a drain of the fifth NMOS transistor is connected to the seventh node, a source of the fifth NMOS transistor is connected to a drain of the sixth NMOS transistor, a source of the sixth NMOS transistor is connected to ground, a gate of the fifth NMOS transistor receives one of the first signal or the first control signal, and a gate of the sixth NMOS transistor receives the other of the first signal or the first control signal; and a seventh NMOS transistor and an eighth NMOS transistor, wherein a drain of the seventh NMOS transistor is connected to the eighth node, a source of the seventh NMOS transistor is connected to a drain of the eighth NMOS transistor, a source of the eighth NMOS transistor is connected to the ground, a gate of the seventh NMOS transistor receives one of the second signal or the first control signal, and a gate of the eighth NMOS transistor receives the other of the second signal or the first control signal; and the second input circuit comprises:

a ninth NMOS transistor and a tenth NMOS transistor, wherein a drain of the ninth NMOS transistor is connected to the seventh node, a source of the ninth NMOS transistor is connected to a drain of the tenth NMOS transistor, a source of the tenth NMOS transistor is connected to the ground, a gate of the ninth NMOS transistor receives one of the third signal or the second control signal, and a gate of the tenth NMOS transistor receives the other of the third signal or the second control signal; and an eleventh NMOS transistor and a twelfth NMOS transistor, wherein a drain of the eleventh NMOS transistor is connected to the eighth node, a source of the eleventh NMOS transistor is connected to a drain of the twelfth NMOS transistor, a source of the twelfth NMOS transistor is connected to the ground, a gate of the eleventh NMOS transistor receives one of the fourth signal or the second control signal, and a gate of the twelfth NMOS transistor receives the other of the fourth signal or the second control signal.

11. The data receiving circuit of claim 1, wherein the latch circuit comprises:

a thirteenth NMOS transistor and a seventh PMOS transistor, wherein a gate of the thirteenth NMOS transistor and a gate of the seventh PMOS transistor are connected to the second output node, a source of the thirteenth NMOS transistor is connected to the seventh node, a drain of the thirteenth NMOS transistor and a drain of the seventh PMOS transistor are both connected to the first output node, and a source of the seventh PMOS transistor is connected to a power node; and a fourteenth NMOS transistor and an eighth PMOS transistor, wherein a gate of the fourteenth NMOS transistor and a gate of the eighth PMOS transistor are connected to the first output node, a source of the fourteenth NMOS transistor is connected to the eighth node, a drain of the fourteenth NMOS transistor and a drain of the eighth PMOS transistor are connected to the second output node, and a source of the eighth PMOS transistor is connected to the power node.

12. The data receiving circuit of claim 1, wherein the second amplification circuit further comprises:

a third reset circuit, connected between a power node and an output end of the latch circuit, and configured to reset the output end of the latch unit.

13. The data receiving circuit of claim 12, wherein the third reset circuit comprises:

a ninth PMOS transistor, connected between the first output node and a power node, wherein a gate of the ninth PMOS transistor receives a fourth sampling clock signal; and a tenth PMOS transistor, connected between the second output node and the power node, wherein a gate of the tenth PMOS transistor receives the fourth sampling clock signal.

14. A data receiving system, comprising:

a plurality of cascaded data transmission circuits, each of which comprises the data receiving circuit of claim 1 and a latch circuit connected to the data receiving circuit, wherein an output signal of the data transmission circuit in a previous stage is used as a feedback signal of the data transmission circuit in a next stage; and an output signal of the data transmission circuit in a last stage is used as a feedback signal of the data transmission circuit in a first stage.

15. The data receiving system of claim 14, wherein the data receiving circuit receives data in response to a sampling clock signal; and the data receiving system comprises 4 cascaded data transmission circuits, and a phase difference between the sampling clock signals of the adjacent stage data receiving circuits is 90°.

16. The data receiving system of claim 14, wherein a decision equalization enable circuit of the data receiving circuit in a current stage is connected to an output end of a second amplification circuit of the data receiving circuit in a previous stage; and a first output signal and a second output signal outputted by the second amplification circuit of the data receiving circuit in the previous stage are used as the feedback signals of the data receiving circuit in a next stage.

17. The data receiving system of claim 14, wherein a decision equalization enable circuit of the data receiving circuit in a current stage is connected to an output end of the latch circuit in the previous stage; and a signal outputted by the latch circuit in the previous stage is used as the feedback signal of the data receiving circuit in the next stage.

18. A storage apparatus, comprising:

a plurality of data ports; and a plurality of data receiving systems of claim 14 each of which corresponds to a data port.

* * * * *